(12) United States Patent
Ryan et al.

(10) Patent No.: US 10,236,047 B1
(45) Date of Patent: Mar. 19, 2019

(54) SHARED OSCILLATOR (STNO) FOR MRAM ARRAY WRITE-ASSIST IN ORTHOGONAL STT-MRAM

(71) Applicant: Spin Memory, Inc., Fremont, CA (US)

(72) Inventors: Eric Michael Ryan, Fremont, CA (US); Marcin Jan Gajek, Berkeley, CA (US); Kadriye Deniz Bozdag, Sunnyvale, CA (US); Michail Tzoufras, Sunnyvale, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/859,015

(22) Filed: Dec. 29, 2017

(51) Int. Cl.
| G11C 11/16 | (2006.01) |
| H01L 43/10 | (2006.01) |
| H01L 43/02 | (2006.01) |
| H01L 43/08 | (2006.01) |
| H01L 27/22 | (2006.01) |
| H01F 10/32 | (2006.01) |

(52) U.S. Cl.
CPC ........ G11C 11/161 (2013.01); G11C 11/1675 (2013.01); H01F 10/329 (2013.01); H01F 10/3286 (2013.01); H01L 27/228 (2013.01); H01L 43/02 (2013.01); H01L 43/08 (2013.01); H01L 43/10 (2013.01)

(58) Field of Classification Search
CPC ........ G11C 11/14–11/16; G11C 11/161; G11C 11/1675; H01L 43/02; H01L 43/08; H01L 43/10

See application file for complete search history.

(56) References Cited

U.S. PATENT DOCUMENTS

| 341,801 A | 5/1886 | Fox |
| 5,541,868 A | 7/1996 | Prinz |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |

(Continued)

FOREIGN PATENT DOCUMENTS

| CA | 2766141 A1 | 1/2011 |
| CN | 101036195 A | 9/2008 |

(Continued)

OTHER PUBLICATIONS

International Search Report and Written Opinion dated May 10, 2018 in PCT/US2018/014645; 14 pages.

(Continued)

*Primary Examiner* — Allison Bernstein
(74) *Attorney, Agent, or Firm* — Arnold & Porter Kaye Scholer

(57) ABSTRACT

Methods and structures useful for magnetoresistive random-access memory (MRAM) are disclosed. The MRAM device has plurality of magnetic tunnel junction (MTJ) stack having significantly improved performance of the free layers in the MTJ structures. The MRAM device utilizes a spin torque nano-oscillator (STNO), a metallic bit line and a plurality of orthogonal spin transfer magnetic tunnel junctions (OST-MTJs), each OST-MTJ comprising an in-plane polarizer, and a perpendicular MTJ.

34 Claims, 15 Drawing Sheets

(56) References Cited

U.S. PATENT DOCUMENTS

| | | |
|---|---|---|
| 5,732,016 A | 3/1998 | Chen et al. |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,149,106 B2 | 12/2006 | Mancoff et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,378,699 B2 | 5/2008 | Chan et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,630,232 B2 | 12/2009 | Guo |
| 7,643,332 B2 | 1/2010 | Leuschner |
| 7,679,155 B2 | 3/2010 | Korenivski |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama et al. |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,779,537 B2 | 7/2014 | Huai |
| 8,823,118 B2 | 9/2014 | Horng |
| 8,852,760 B2 | 10/2014 | Wang et al. |
| 8,860,156 B2 | 10/2014 | Beach |
| 8,878,317 B2 | 11/2014 | Daibou et al. |
| 9,019,754 B1 | 4/2015 | Bedeschi |
| 9,025,368 B2 | 5/2015 | Saida et al. |
| 9,082,888 B2 | 7/2015 | Kent et al. |
| 9,117,995 B2 | 8/2015 | Daibou et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 3/2016 | Pinarbasi et al. |
| 9,362,486 B2 | 6/2016 | Kim et al. |
| 9,378,817 B2 | 6/2016 | Lee et al. |
| 9,379,314 B2 | 6/2016 | Park |
| 9,406,876 B2 | 8/2016 | Pinarbasi |
| 9,472,282 B2 | 10/2016 | Lee et al. |
| 9,472,748 B2 | 10/2016 | Kuo et al. |
| 9,484,527 B2 | 11/2016 | Han et al. |
| 9,548,445 B2 | 1/2017 | Lee et al. |
| 9,589,616 B2 | 3/2017 | Meng et al. |
| 9,728,712 B2 | 8/2017 | Kardasz et al. |
| 9,741,926 B1 | 8/2017 | Pinarbasi et al. |
| 9,773,540 B2 | 9/2017 | Zang et al. |
| 9,773,974 B2 | 9/2017 | Pinarbasi et al. |
| 9,818,464 B2 * | 11/2017 | Saida .................. H01F 10/3286 |
| 9,853,206 B2 * | 12/2017 | Pinarbasi ................ H01L 43/08 |
| 10,026,892 B2 | 7/2018 | Pinarbasi et al. |
| 10,032,978 B1 | 7/2018 | Schabes et al. |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0125649 A1 | 7/2004 | Durlam et al. |
| 2004/0130936 A1 | 7/2004 | Nguyen et al. |
| 2004/0257717 A1 | 12/2004 | Sharma et al. |

(56) References Cited

U.S. PATENT DOCUMENTS

| | | |
|---|---|---|
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0047294 A1 | 3/2007 | Panchula |
| 2007/0096229 A1 | 5/2007 | Yoshikawa et al. |
| 2007/0242501 A1 | 10/2007 | Hung et al. |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1 | 8/2009 | Wang et al. |
| 2009/0209102 A1 | 8/2009 | Zhong et al. |
| 2009/0231909 A1 | 9/2009 | Dieny et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2010/0304204 A1 | 12/2010 | Routkevitch et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0141804 A1 | 6/2011 | Apalkov et al. |
| 2011/0149632 A1 | 6/2011 | Chen et al. |
| 2011/0216436 A1 | 9/2011 | Igarashi |
| 2012/0052258 A1 | 3/2012 | Op DeBeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0119495 A1 | 5/2013 | Vetro et al. |
| 2013/0157385 A1 | 6/2013 | Jung et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1 | 3/2014 | Ohsawa |
| 2014/0093701 A1 | 4/2014 | Sahoo et al. |
| 2014/0103472 A1 | 4/2014 | Kent et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim |
| 2014/0264671 A1 | 9/2014 | Chepulskyy et al. |
| 2015/0008550 A1 | 1/2015 | Min et al. |
| 2015/0056368 A1 | 2/2015 | Wang et al. |
| 2015/0171316 A1 | 6/2015 | Park et al. |
| 2015/0279904 A1 | 10/2015 | Pinarbasi |
| 2015/0287910 A1 | 10/2015 | Lu |
| 2015/0357015 A1 | 12/2015 | Kent et al. |
| 2016/0027999 A1 | 1/2016 | Pinarbasi |
| 2016/0087193 A1 | 3/2016 | Pinarbasi et al. |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0276006 A1 | 9/2016 | Ralph et al. |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1 | 12/2016 | Pinarbasi et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0324029 A1 | 11/2017 | Pinarbasi et al. |
| 2017/0331032 A1 | 11/2017 | Chen et al. |
| 2017/0331033 A1 | 11/2017 | Kardasz et al. |
| 2017/0346002 A1 | 11/2017 | Pinarbasi et al. |
| 2018/0047894 A1 | 2/2018 | Pinarbasi et al. |
| 2018/0076382 A1 | 3/2018 | Park et al. |
| 2018/0114898 A1 | 4/2018 | Lee |
| 2018/0248110 A1 | 8/2018 | Kardasz et al. |
| 2018/0248113 A1 | 8/2018 | Pinarbasi et al. |

FOREIGN PATENT DOCUMENTS

| | | |
|---|---|---|
| CN | 102334207 A | 1/2012 |
| CN | 102959693 A | 3/2013 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |
| JP | H10-004012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |

(56) References Cited

FOREIGN PATENT DOCUMENTS

| | | |
|---|---|---|
| JP | 2005-044848 | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-524830 A | 7/2008 |
| JP | 2009-027177 A | 2/2009 |
| JP | 2013-012546 A | 1/2013 |
| JP | 2013-219010 A | 10/2013 |
| JP | 2014-039061 A | 2/2014 |
| JP | 5635666 B2 | 12/2014 |
| JP | 2015-002352 A | 1/2015 |
| JP | 2017-510989 A | 4/2017 |
| JP | 2017-527097 A | 9/2017 |
| JP | 2017-532752 A | 11/2017 |
| KR | 10-2014-0115246 A | 9/2014 |
| KR | 10-2015-0016162 A | 2/2015 |
| WO | WO 2009-080636 A1 | 7/2009 |
| WO | WO 2011-005484 A2 | 1/2011 |
| WO | WO 2014-062681 A1 | 4/2014 |
| WO | WO-2015-153142 A1 | 10/2015 |
| WO | 2016011435 A1 | 1/2016 |
| WO | WO-2016-014326 A1 | 1/2016 |
| WO | WO-2016-048603 A1 | 3/2016 |
| WO | WO-2016-171800 A1 | 10/2016 |
| WO | WO-2016-171920 A1 | 10/2016 |
| WO | WO-2016-204835 A1 | 12/2016 |
| WO | WO-2017-019134 A1 | 2/2017 |
| WO | WO-2017-030647 A1 | 2/2017 |
| WO | WO-2017-131894 A1 | 8/2017 |

OTHER PUBLICATIONS

International Search Report and Written Opinion dated May 30, 2018 in PCT/US2018/014641; 13 pages.
R.H. Koch, et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
K.J. Lee, et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
Kirsten Martens, et al., "Thermally Induced Magnetic Switching in Thin Ferromagnetic Annuli"; NSF grants PHY-0351964 (DLS); 2005; 11 pages.
Kirsten Martens, et al., "Magnetic Reversal in Nanoscopic Ferromagnetic Rings"; NSF grants PHY-0351964 (DLS); 2006; 23 pages.
"Magnetic Technology Sprintronics, Media and Interface"; Data Storage Institute, R&D Highlights; Sep. 2010; 3 pages.
S. Ikeda, et al.; "A perpendicular-anisotropy CoFeB—MgO magnetic tunnel junction"; Nature Materials, vol. 9, Sep. 2010; pp. 721-724; 4 pages.
Soo-Man Seo, et al.; "Current-induced synchronized switching of magnetization;" Applied Physics Letters 101; 2012 American Institute of Physics; Aug. 7, 2012; 6 pages.
Kent, et al.; U.S. Appl. No. 61/715,111, filed Oct. 17, 2012, entitled "Inverted Orthogonal Spin Transfer Layer Stack".
Pinarbasi, et al.; U.S. Appl. No. 14/341,185, filed Jul. 25, 2014, entitled "Method for Manufacturing MTJ Memory Device".
Pinarbasi, et al.; U.S. Appl. No. 14/492,943, filed Sep. 22, 2014, entitled "Magnetic Tunnel Junction Structure for MRAM Device".
International Search Report and Written Opinion dated Jul. 10, 2015 in PCT/US2015/021580; 12 pages.
Pinarbasi, et al.; U.S. Appl. No. 14/814,036, filed Jul. 30, 2015, entitled "Precessional Spin Current Structure for MRAM".
Kardasz, et al.; U.S. Appl. No. 14/866,359, filed Sep. 25, 2015, entitled "Spin Transfer Torque Structure for MRAM Devices Having a Spin Current Injection Capping Layer".
International Search Report and Written Opinion dated Oct. 30, 2015 in PCT/US2015/040700; 11 pages.

International Search Report and Written Opinion dated Dec. 14, 2015 in PCT/US2015/047875; 13 pages.
Pinarbasi, et al.; U.S. Appl. No. 15/041,325, filed Feb. 11, 2016, entitled "Method for Manufacturing MTJ Memory Device".
Kardasz, et al.; U.S. Appl. No. 15/091,853, filed Apr. 6, 2016, entitled "High Annealing Temperature Perpendicular Magnetic Anisotropy Structure for Magnetic Random Access Memory".
Pinarbasi, et al.; U.S. Appl. No. 15/093,367, filed Apr. 7, 2016, entitled "Magnetic Tunnel Junction Structure for MRAM Device".
Pinarbasi, et al.; U.S. Appl. No. 15/097,576, filed Apr. 13, 2016, entitled "Polishing Stop Layer(s) for Processing Arrays of Semiconductor Elements".
Pinarbasi, et al.; U.S. Appl. No. 15/157,783, filed May 18, 2016, entitled "Memory Cell Having Magnetic Tunnel Junction and Thermal Stability Enhancement Layer".
Berger, et al.; U.S. Appl. No. 15/174,482, filed Jun. 6, 2016, entitled "Method and Apparatus for Bipolar Memory Write-Verify".
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
Pinarbasi, et al.; U.S. Appl. No. 15/445,260, filed Feb. 28, 2017, entitled "Precessional Spin Current Structure for MRAM".
Pinarbasi, et al.; U.S. Appl. No. 15/445,362, filed Feb. 28, 2017, entitled "Precessional Spin Current Structure for MRAM".
International Search Report and Written Opinion dated Apr. 7, 2017 in PCT/US2016/067444; 13 pages.
Notice of Allowance dated Apr. 21, 2017 in U.S. Appl. No. 15/157,783; 36 pages.
Pinarbasi, et al.; U.S. Appl. No. 15/656,398, filed Jul. 21, 2017, entitled "Memory Cell Having Magnetic Tunnel Junction and Thermal Stability Enhancement Layer".
Kardasz, et al.; U.S. Appl. No. 15/657,498, filed Jul. 24, 2017, entitled "Spin Transfer Torque Structure for MRAM Devices Having a Spin Current Injection Capping Layer".
Notice of Allowance dated Jul. 27, 2017 in U.S. Appl. No. 15/097,576; 22 pages.
Pinarbasi, et al.; U.S. Appl. No. 15/674,620, filed Aug. 11, 2017, entitled "Polishing Stop Layer(s) for Processing Arrays of Semiconductor Elements".
Schabes, et al.; U.S. Appl. No. 15/634,629, filed Jun. 27, 2017, entitled "MRAM with Reduced Stray Magnetic Fields".
Notice of Allowance dated Oct. 16, 2017 in U.S. Appl. No. 14/814,036; 16 pages.
Pinarbasi, et al.; U.S. Appl. No. 15/794,871, filed Oct. 26, 2017, entitled "Precessional Spin Current Structure for MRAM".
Tzoufras, et al.; U.S. Appl. No. 15/858,950, filed Dec. 29, 2017, entitled "AC Current Pre-Charge Write-Assist in Orthogonal STT-MRAM".
Gajek, et al.; U.S. Appl. No. 15/858,988, filed Dec. 29, 2017, entitled "Self-Generating AC Current Assist in Orthogonal STT MRAM".
Tzoufras, et al.; U.S. Appl. No. 15/859,030, filed Dec. 29, 2017, entitled "AC Current Write-Assist in Orthogonal STT-MRAM".
Bozdag, et al.; U.S. Appl. No. 15/859,047, filed Dec. 29, 2017, entitled "Three-Terminal MRAM with AC Write-Assist for Low Read Disturb".
Schabes, et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Schabes, et al.; U.S. Appl. No. 15/859,384, filed Dec. 30, 2017, entitled "Perpendicular Magnetic Tunnel Junction Device with Skyrmionic Assist Layers for Free Layer Switching".

(56) References Cited

OTHER PUBLICATIONS

Schabes, et al.; U.S. Appl. No. 15/859,381, filed Dec. 30, 2017, entitled "Perpendicular Magnetic Tunnel Junction Device with Precessional Spin Current Layer Having a Modulated Moment Density".
Schabes, et al.; U.S. Appl. No. 15/859,379, filed Dec. 30, 2017, entitled "Perpendicular Magnetic Tunnel Junction Device with Offset Precessional Spin Current Layer".
Schabes, et al.; U.S. Appl. No. 15/859,374, filed Dec. 30, 2017, entitled "Switching and Stability Control for Perpendicular Magnetic Tunnel Junction Device".
El Baraji, et al.; U.S. Appl. No. 15/859,514, filed Dec. 30, 2017, entitled "Microwave Write-Assist in Orthogonal STT-MRAM".
El Baraji, et al.; U.S. Appl. No. 15/859,517, filed Dec. 30, 2017, entitled "Microwave Write-Assist in Series-Interconnected Orthogonal STT-MRAM Devices".
Final Office Action dated Jul. 9, 2015 in U.S. Appl. No. 14/242,419; 19 pages.
Final Office Action dated Jun. 9, 2017 in U.S. Appl. No. 14/814,038; 19 pages.
Final Office Action dated Aug. 2, 2018 in U.S. Appl. No. 15/674,620.
NonFinal Office Action dated Mar. 20, 2015 in U.S. Appl. No. 14/242,419; 18 pages.
NonFinal Office Action dated Sep. 11, 2015 in U.S. Appl. No. 14/492,943; 13 pages.
NonFinal Office Action dated Jan. 20, 2016 in U.S. Appl. No. 14/242,419; 17 pages.
NonFinal Office Action dated Dec. 9, 2017 in U.S. Appl. No. 14/866,359; 26 pages.
NonFinal Office Action dated Dec. 23, 2016 in U.S. Appl. No. 15/093,367; 13 pages.
NonFinal Office Action dated Jan. 25, 2017 in U.S. Appl. No. 15/097,576; 17 pages.
NonFinal Office Action dated Feb. 6, 2017 in U.S. Appl. No. 14/814,036; 22 pages.
NonFinal Office Action dated Jun. 29, 2018 in U.S. Appl. No. 15/859,381.
Nonfinal Office Action dated Jun. 26, 2018 in U.S. Appl. No. 15/859,384.
NonFinal Office Action dated Jun. 29, 2018 in U.S. Appl. No. 15/859,374.
Notice of Allowance dated Sep. 26, 2018 in U.S. Appl. No. 15/859,047; 10 pages.
Notice of Allowance dated Oct. 24, 2018 in U.S. Appl. No. 15/859,517.
Office Action dated Aug. 30, 2018 in Chinese Patent Application No. 201580009984.2.
Office Action dated Oct. 9, 2018 in Japanese Patent Application No. 2016-526761.

\* cited by examiner

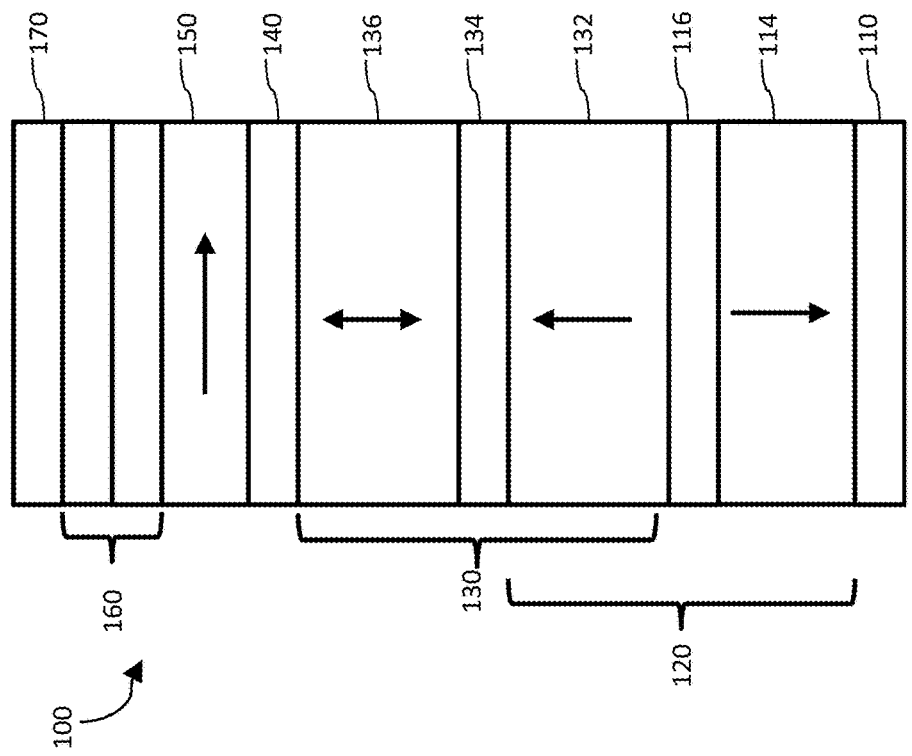

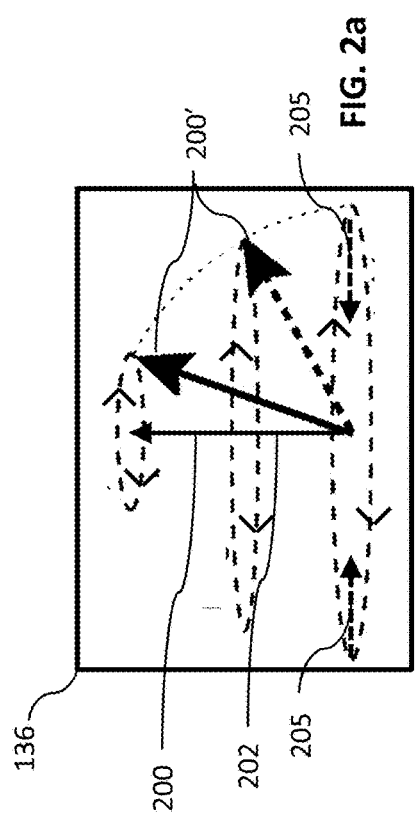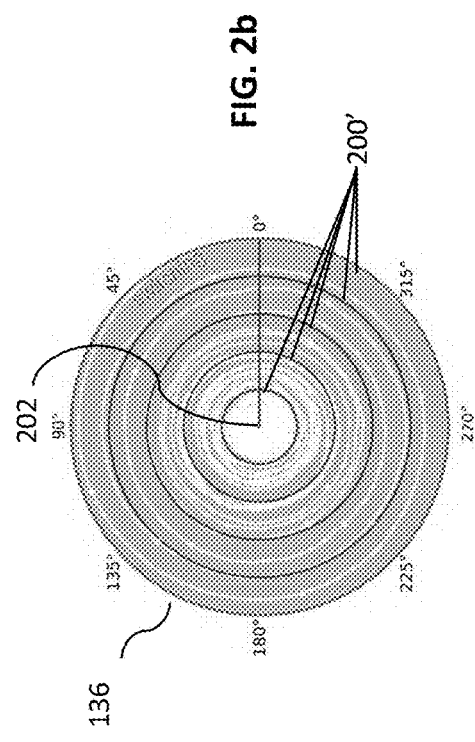

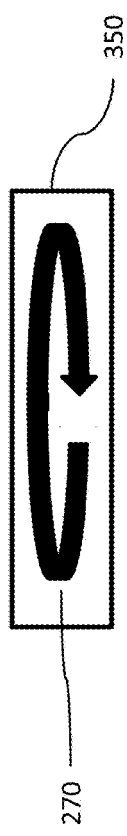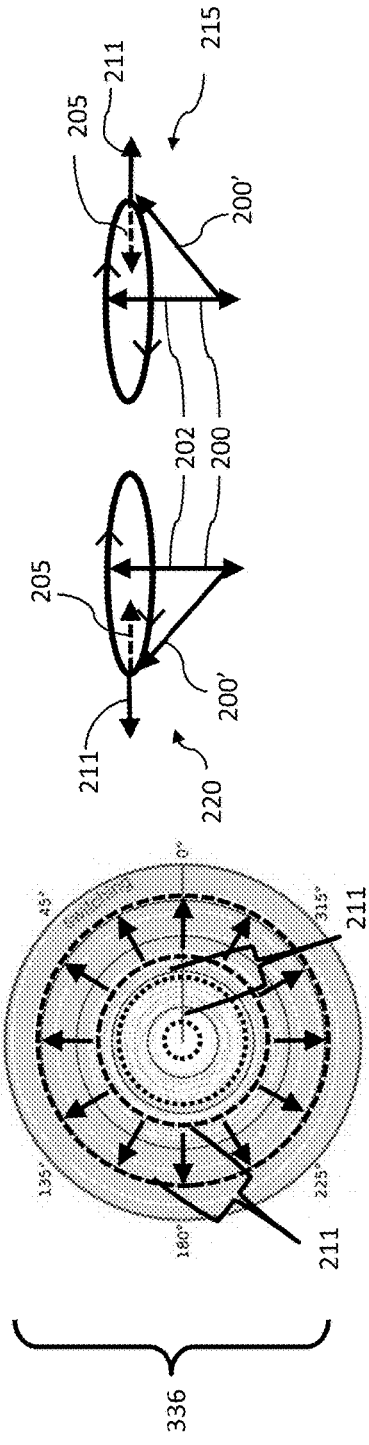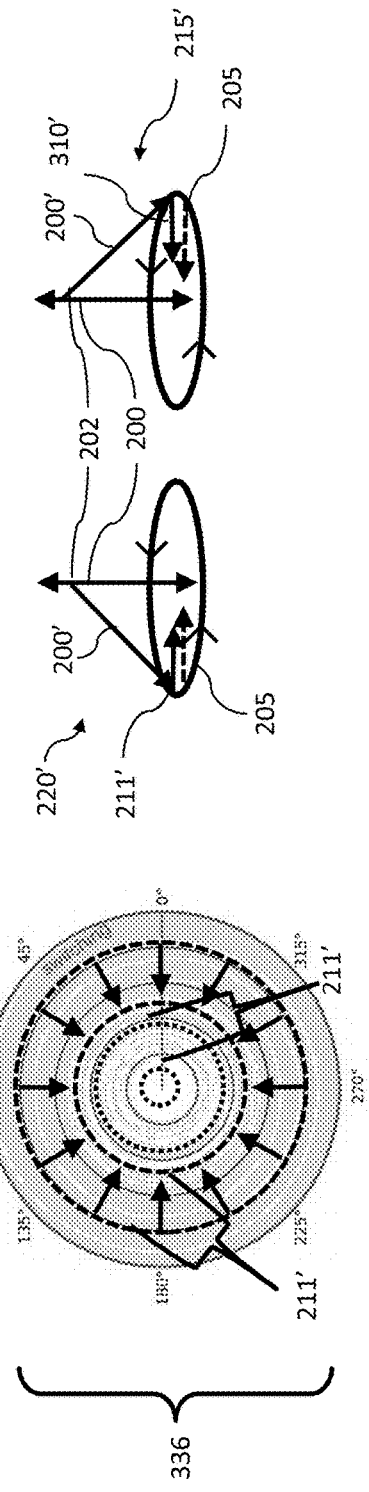
FIG. 4a
FIG. 4b

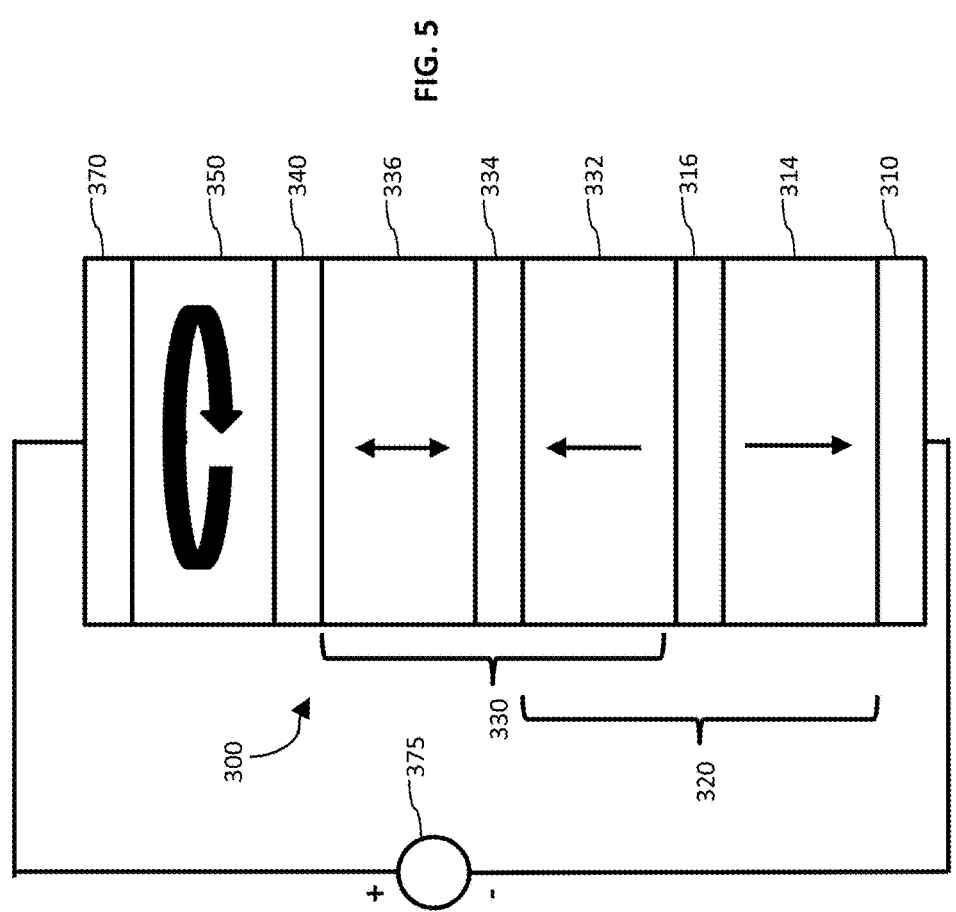

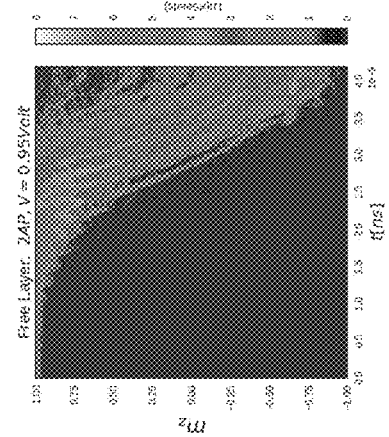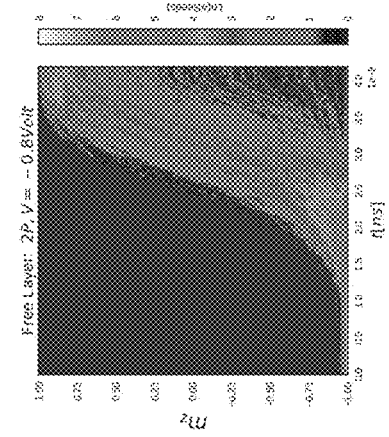
FIG. 11a
FIG. 11b
* For the p-OST the voltage is quoted across the pOST structure only

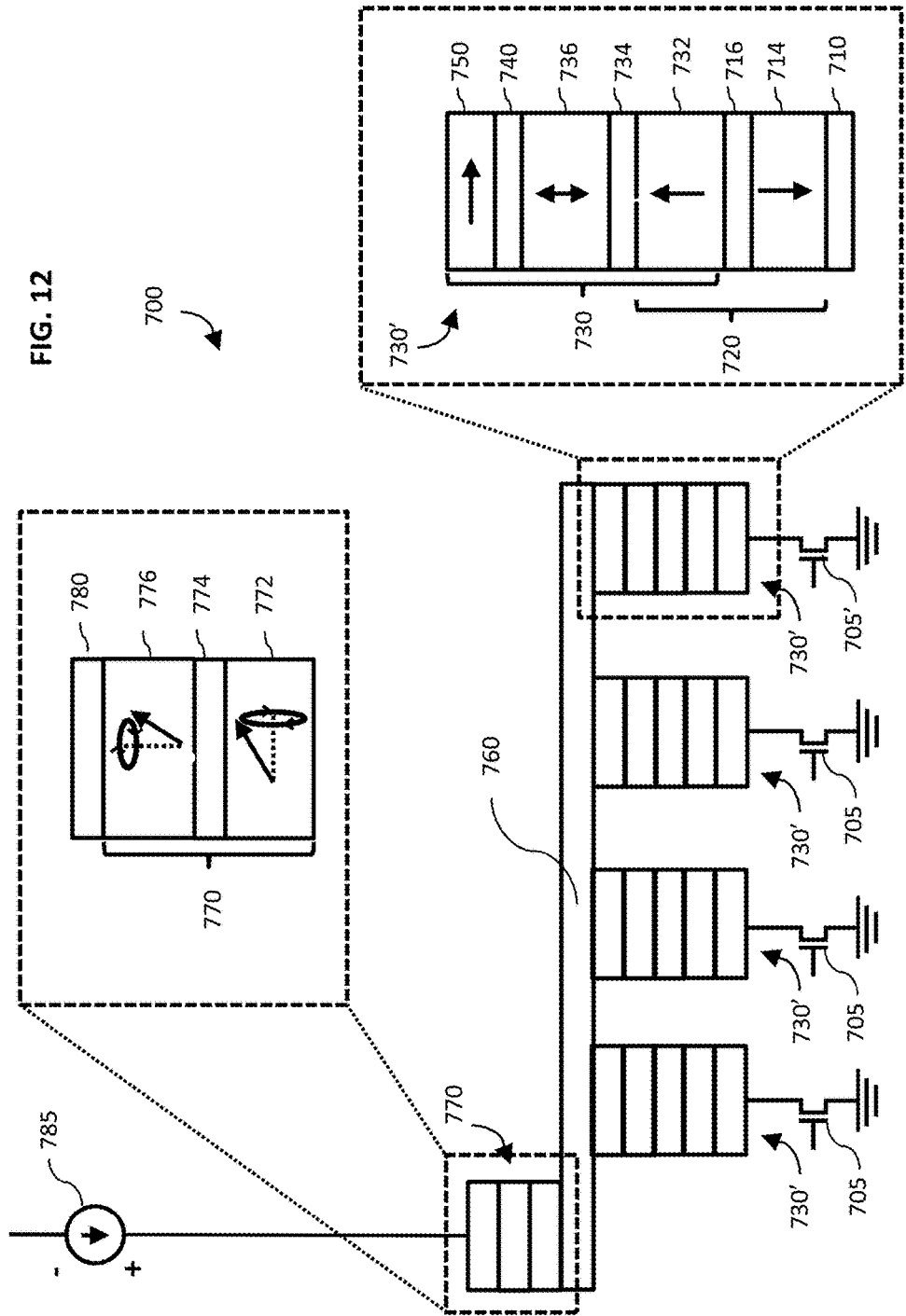

SHARED OSCILLATOR (STNO) FOR MRAM ARRAY WRITE-ASSIST IN ORTHOGONAL STT-MRAM

FIELD

The present patent document relates generally to spin-transfer torque magnetic random access memory and, more particularly, to a magnetic tunnel junction stack having improved performance of the free layer in the magnetic tunnel junction structure.

BACKGROUND

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. In general, one of the plates has its magnetization pinned (i.e., a "reference layer"), meaning that this layer has a higher coercivity than the other layer(s) and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetic fields of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

Spin transfer torque or spin transfer switching, uses spin-aligned ("polarized") electrons to change the magnetization orientation of the free layer in the magnetic tunnel junction ("MTJ"). In general, electrons possess a spin, a quantized number of angular momentum intrinsic to the electron. An electrical current is generally unpolarized, i.e., it consists of 50% spin up and 50% spin down electrons. Passing a current though a magnetic layer polarizes electrons with the spin orientation corresponding to the magnetization direction of the magnetic layer thus produces a spin-polarized current. If a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

When a current is passed through a magnetic layer (e.g., a polarizer), the spin orientation of the electrons that flow out of the magnetic layer is generally aligned in the direction of the magnetization of the magnetic layer and will exert a spin-transfer torque in that direction (forming a transverse spin current) upon impinging on another magnetic layer. However, due to the conservation of angular moment for the system, the electrons on the opposite side of magnetic layer, those that do not go through the magnetic layer, generally have a spin orientation that is aligned in the direction that is anti-parallel to the magnetization direction of the magnetic layer. The net effect of this process is that the current applied to the magnetic layer undergoes spin filtering, which creates a spin current on one side of the magnetic layer, with spins that are aligned with magnetization direction of the magnetic layer, and a reflected spin current on the other side of the magnetic layer, with spins that are anti-parallel to the magnetization direction of the magnetic layer. This effect occurs upon application of a current to any magnetic layer, including an in-plane polarization layer or an out-of-plane reference magnetic layer. Thus, in a typical MTJ, when switching the magnetization direction of the free layer in one direction (e.g., from the parallel to anti-parallel state) is achieved using spin transfer torque from the transverse spin current, switching the free layer in the other direction (e.g., from the anti-parallel to parallel states) would be achieved using spin transfer torque from the reflected spin current. This is typically accomplished by running electrical current through the MTJ in one direction when switching from the anti-parallel to parallel state and running the electrical current through the MTJ in the other direction when switching from the parallel to anti-parallel state.

FIG. 1 illustrates a MTJ stack 100 for an MRAM device including a magnetic tunnel junction MTJ 130 and a top polarizer layer 150. As shown, stack 100 includes one or more seed layers 110 provided at the bottom of stack 100 to initiate a desired crystalline growth in the above-deposited layers. Furthermore, MTJ 130 is deposited on top of Synthetic Anti-Ferromagnetic (SAF) layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the non-magnetic tunneling barrier layer 134 and free layer 136 are formed on reference layer 132. As shown in FIG. 1, magnetic reference layer 132 has a magnetization direction perpendicular to its plane. As also seen in FIG. 1, free layer 136 also has a magnetization direction perpendicular to its plane, but its direction can vary by 180 degrees.

The first magnetic layer 114 in the SAF layer 120 is disposed over seed layer 110. SAF layer 120 also has an antiferromagnetic coupling layer 116 disposed over the first magnetic layer 114. Furthermore, a nonmagnetic spacer 140 is disposed on top of MTJ 130 and a polarizer 150 is disposed on top of the nonmagnetic spacer 140. Polarizer 150 is a magnetic layer that has a magnetic direction in its plane, but is perpendicular to the magnetic direction of the reference layer 132 and free layer 136. Polarizer 150 is provided to polarize a current of electrons ("spin-aligned electrons") applied to MTJ structure 100. Polarizer 150 polarizes the current in a direction perpendicular (orthogonal) to those of the magnetizations of the free magnetic layer 136 and reference magnetic layer 132. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a combination of reactive ion etch (RIE) and ion beam etching (IBE) processes.

Various mechanisms have been proposed to assist the free-layer magnetization switching in MTJ devices. One issue has been that to realize the orthogonal spin transfer effect for in-plane MTJ structures, large spin currents may be required for switching. The need for large switching currents may limit such device's commercial applicability. One way proposed to reduce switching current is to lower the magnetization of the free layer. However, if the effective magnetization of the free layer is lowered significantly, the orthogonal effect has to be limited so that the free-layer does not go into precessional mode that would make the end state of the free-layer magnetization un-deterministic. This defines the operation window for the in-plane OST structures. In an in-plane device, unlike that shown in FIG. 1, the magnetization direction of the reference layer and free layer are in the plane of the layer. Another aspect of in-plane devices is that the thermal stability requirements may limit the size of the MTJ devices to approximately sixty nanometers or higher.

In contrast to MTJ structures with an in-plane free layer and a perpendicular polarizer, perpendicular MTJ structures, such as those shown in FIG. 1, are less prone to getting into a pure precessional regime. This is due to the fact that in perpendicular MTJ structures, the direction of the demagnetization field and perpendicular anisotropy contributions are the same. In this case the precession is generally not an issue and the end-state is more deterministic. However, precession may be an issue with regards to read disturb, particularly when stronger read currents are used. The orthogonal polarizer acts on the free layer magnetization at the initial state, but when the precession takes hold, the fixed orthogonal polarizer 150 helps only half the cycle of the free-layer magnetization rotation while it harms the other half of the cycle. This is demonstrated with reference to FIGS. 2-3. FIG. 2a-2b shows switching of a free layer 136 of an MTJ. As is seen, free layer 136 has a magnetization direction 200 perpendicular to that of the polarizer 150. The magnetization direction 200 of the free layer 136 can rotate by 180 degrees. FIGS. 2a-2b show precession about the axis of the magnetization vector of free layer 136. During precession, magnetic vector 200 begins to rotate about its axis in a cone-like manner such that its magnetization vector 200' deflects from the perpendicular axis 202 of free layer 136. Whereas prior to initiating precession, no component of magnetic vector 200 is in the plane of free layer 136, once precession starts, a component of magnetic vector 200' can be found both in-plane and orthogonal to free layer 136. As magnetic vector 200' continues to precess (i.e., to switch), the rotation of vector 200' extends further from the center of free layer 136, as is seen in FIG. 2b.

In most prior MTJ devices using a polarizer such as polarizer 150, the magnetization direction of polarizer 150 is fixed, which is shown in FIGS. 1 and 3. See also U.S. Pat. No. 6,532,164, which states that the direction of the magnetization of the polarizing layer cannot vary in the presence of current. Prior to current passing through the MTJ, the free layer 136 has a magnetization direction 200 perpendicular to that of the polarizer 150. While the magnetization direction 200 of the free layer 136 can rotate by 180 degrees, such rotation is normally precluded by the free layer's inherent damping ability 205, which is represented by a vector 205 pointing to axis 202 (shown as a dashed line in FIG. 2a as well as FIG. 3). Axis 202 is perpendicular to the plane of free layer 136. This damping 205 has value, defined by the damping constant, which maintains the magnetization direction of the free layer 136.

The precession of the magnetization vector during switching of the free layer can be assisted by spin transfer torque exerted by the electrons of a spin-polarized current, which is generated in part by the orthogonal polarizer 150. Applying a current to the MTJ device 100 produces a spin-polarized current, which exerts a spin transfer torque on the magnetic vector 200. This spin transfer torque has an in-plane component of the spin transfer torque 210, which pushes magnetization vector 200' in the direction of the magnetic vector of polarizer 150 throughout precession of magnetic vector 200'. In addition to the in-plane spin transfer torque 210 from the polarizer, the perpendicular spin transfer torque (not shown), generated by reference layer 132, pulls the magnetic vector 200' towards the direction antiparallel to its initial direction 200, thereby causing switching of the free layer 136. In devices like those shown in FIG. 1, when the spin transfer torque 210 begins to help overcome the damping 205 inherent to the free layer 136, the magnetic direction 200' begins to precess about its axis, as shown in FIG. 2a. As seen in FIG. 3, in-plane spin transfer torque 210 helps the magnetization direction of the free layer 136 to precess in a cone-like manner around an axis 202 perpendicular to the plane of the layers. When a spin polarized current traverses the stack 100, the magnetization of the free layer 136 precesses in a continuous manner (i.e., it turns on itself in a continuous manner as shown in FIG. 3) with maintained oscillations until the magnetic direction of free layer 136 is opposite the magnetic direction prior to the spin torque causing precession, i.e., the magnetic direction of free layer 136 switches by 180 degrees.

FIG. 3 illustrates precession of a free layer 136 of an MTJ assisted by orthogonal spin polarized current. The spin polarized electrons from polarizer 150 provide a spin transfer torque which has a component 210 in the plane of the precession (i.e., in-plane spin transfer torque) that helps overcome the damping 205 in the first half of the precession 215 because the in-plane spin transfer torque 210 provided by the spin polarized current is opposite that of the inherent damping 205 of the free layer 136. This is shown on the right-hand side of the middle portion of FIG. 3, which illustrates the projection of spin transfer torque 210 onto the precession plane (i.e., the plane defined by axis 200 and magnetization vector 200' as it steadily precesses around axis 200). However, the in-plane spin transfer torque actually harms the switching process during the second half of the precession 220. The reason for this is that the spin of the electrons in the spin polarized current only apply an in-plane spin transfer torque 210 in the direction of their polarization, which is aligned with the magnetic direction of the in-plane polarization layer 150. Thus, when the magnetic vector is in the half of the precession cycle 220 that is opposite the spin of the polarized electrons, the in-plane spin transfer torque 210 actually works with the inherent damping 205 of free layer 136 to make rotation more difficult. This is shown in the left-hand side of the middle portion of FIG. 3 and can be seen in the projection of the spin transfer torque 210 onto the precessional plane of the free layer 136, which is depicted on the bottom of FIG. 3. Indeed, it is the perpendicular spin transfer torque created by the reference layer 132 (not shown in FIG. 3) that overcomes the damping 205 of free layer 136 as well as the in-plane spin transfer torque 210 during the half of a precession cycle where the spin of the electrons harms precession, and thus it is the reference layer 132 that allows for completion of precession. The precessional dynamics and the directionality of the spin transfer torque depicted in FIG. 3 are merely approximations at small magnetization polar angles and do not necessarily reflect the phenomena occurring at larger magnetization polar angles. However, the precessional dynamics that occur when the magnetization vector of the free layer 132 is at small magnetization polar angles are, to a large extent, determinative of the efficiency of the switching process.

One solution that has been proposed to overcome this limitation is the use of a precessional spin current ("PSC") magnetic layer having a magnetization vector that can freely rotate in any magnetic direction, shown in FIG. 4a-b. The free layer 336 is similar to the free layer 136 previously discussed, in that it has an inherent damping characteristic 205 that can be overcome with the assistance of spin transfer torque. However, the polarizing layer 150 is replaced with a precessional magnetic layer 350. As seen in FIG. 4a, which shows the projection onto the precessional plane of the direction of the spin transfer torque 211 created by spin current passing through free layer 336, the direction of spin transfer torque 211 changes with the rotation of PSC magnetic layer 350. As seen on the right side of FIG. 4a, spin transfer torque 211 causes the magnetization direction 200' of the free layer 336 to precess in a cone-like manner around an axis 202 perpendicular to the plane of the layers. The PSC layer 350 and the free-layer 336 are magnetically and/or electronically coupled such that the magnetization direction of the magnetization vector 270 of the PSC magnetic layer 350 follows the precessional rotation of the magnetic vector of the free layer 336.

As seen in on the right-hand side of FIG. 4a, the spin polarized electrons provide torque 211 that helps to overcome the damping 205 in the first half of the precession 215 because the torque 211 provided by the spin polarized current is opposite that of the inherent damping 205 of the free layer 336. In addition, torque 211 helps to overcome the damping 205 in the second half of the precession 220 by the same mechanism. Thus, unlike prior devices having a fixed polarization magnetic layer 150, the spin of the electrons in the spin-polarized current applies a torque 211 in both halves of the precession cycle, including the half of the precession cycle 220 where devices with fixed polarization magnetic layers 150 actually harmed precession. As is seen, the torque 211 continues to help overcome the inherent damping 205 of free layer 136 throughout the entire precession cycle. An MRAM device utilizing an MTJ structure with a PSC is depicted in FIG. 5.

However, because of the chirality of perpendicular MTJ structures that utilize a PSC, such as the structure shown in FIG. 5, the PSC only enhances switching of the free layer in one direction (i.e., from the parallel state to the anti-parallel state, FIG. 4a), but not the other (i.e., from the antiparallel state to the parallel state, FIG. 4b). As discussed above, when switching the free layer 336 from the first direction to the second direction, the spin current is generated by the electrons passing through the PSC layer and the in-plane spin transfer torque 211 is in line with the magnetic vector of the PSC layer (FIG. 4a). However, during switching free layer 336 from the second direction to the first direction, it is the reflected spin current from PSC layer that imparts the in-plane spin transfer torque 211' on the free layer 336. As shown in FIG. 4b, the in-plane spin transfer torque 211' caused by the reflected spin current is in the direction anti-parallel to the magnetic vector 270 of the PSC layer 350. When the magnetic vector 270 is aligned with the magnetic vector 200, the in-plane spin transfer torque 211' might actually enhance the damping characteristic 205 of the free layer 336. Therefore, when the precession of the magnetic vector 270 of the PSC layer 350 is synchronized with the precession of the magnetic vector 200 of the free layer 336, the in-plane spin transfer torque 211' might enhance the damping characteristic 205 throughout the entire precession 220'. Thus, the PSC layer can be highly effective at increasing the switching efficiency of the free layer in one direction, but may actually hamper switching in the other direction.

Thus, in prior devices that utilize in-plane polarization layers having a fixed magnetization direction and having a free magnetic layer 150 that is perpendicular to the plane of the device, once the precession holds, the in-plane spin transfer torque has no net positive effect on the switching mechanism for a full three hundred sixty degree precession. Moreover, in prior devices that utilize a PSC magnetic layer, the in-plane spin transfer torque enhances the switching of the free layer throughout the precession from the first direction to the second direction, but might not enhance the switching of the free layer from the second direction to the first direction.

Therefore, there is a need for a spin torque transfer device that reduces the amount of current needed for switching from both magnetization directions while also switching at high speeds and requiring reduced chip area.

SUMMARY

An MRAM device is disclosed that has a magnetic tunnel junction stack having a significantly improved performance of the free layer in the magnetic tunnel junction structure that requires significantly lower switching currents and which significantly reduces switching times for MRAM applications and maintains this characteristic for both switching directions (AP to P and P to AP)

In one embodiment, a magnetic device includes a plurality of orthogonal spin transfer magnetic tunnel junctions (OST-MTJs) in a first plane. Each OST-MTJ comprises a polarization magnetic layer, a non-magnetic spacer, a reference magnetic layer, a non-magnetic tunnel barrier layer, and a free magnetic layer. The in-plane polarization magnetic layer is separated from the free magnetic layer by the non-magnetic spacer. The free magnetic layer is separated from the reference magnetic layer by the non-magnetic tunnel barrier layer. The in-plane polarization magnetic layer has a magnetization vector that is parallel to the first plane. The reference magnetic layer has a magnetization vector that is perpendicular to the first plane and has a fixed magnetization direction. The free magnetic layer has a magnetization vector that is perpendicular to the first plane and has a magnetization direction that can switch from a first magnetization direction to a second magnetization direction and from the second magnetization direction to the first magnetization direction. The switching process involves precessions at a precession radius around an axis perpendicular to the first plane, and the magnetization vector of the free magnetic layer has a predetermined precession frequency. The magnetic device also includes a metallic bit line in a second plane and coupled to the plurality of OST-MTJs. The magnetic device also includes a spin torque nano oscillator (STNO) in a third plane and coupled to the metallic bit line. The STNO comprises an in-plane spin torque oscillator layer, a non-magnetic spin torque oscillator barrier layer, and a perpendicular spin torque oscillator layer. The in-plane spin torque oscillator layer is separated from the perpendicular spin torque oscillator layer by the non-magnetic spin torque oscillator barrier layer. The in-plane spin torque oscillator layer has a magnetization vector that precesses around an in-plane anisotropy axis or precesses in the third plane upon application of a programming voltage pulse. The perpendicular spin torque oscillator layer has a magnetization vector that precesses around an out-of-plane anisotropy axis upon application of the programming voltage pulse. Application of the programming voltage pulse to the magnetic device results in a switching current pulse. The switching current pulse alternates between a maximum current value and a minimum current value at a first frequency. Application of the switching current pulse to the in-plane polarization magnetic layer, the non-magnetic spacer, and the MTJ results in a spin-polarized current having spin-polarized electrons. The spin-polarized current alternates between a maximum spin-current value and a minimum spin-current value at the first frequency. The spin-polarized electrons exert a spin transfer torque on the magnetization vector of the free magnetic layer. The spin transfer torque alternates between a maximum magnitude and a minimum magnitude at the first frequency. The first frequency is synchronized with the predetermined precession frequency of the free magnetic layer, thereby causing the spin transfer torque to be at the maximum magnitude when the spin transfer torque increases the precession radius of the magnetization vector of the free magnetic layer, and at the minimum magnitude when the spin transfer torque decreases the precession radius of the magnetization vector of the free magnetic layer. In this way, the switching process of the free magnetic layer is improved from the first magnetization direction to the second magnetization direction and from the second magnetization direction to the first magnetization direction.

In another embodiment, a difference in frequency between the first frequency and the predetermined precession frequency of the free magnetic layer is less than twenty percent of the predetermined precession frequency of the free magnetic layer.

In another embodiment, a difference in frequency between the first frequency and the predetermined precession frequency of the free magnetic layer is less than ten percent of the predetermined precession frequency of the free magnetic layer.

In another embodiment, a difference in frequency between the first frequency and the predetermined precession frequency of the free magnetic layer is less than five percent of the predetermined precession frequency of the free magnetic layer.

In another embodiment, a difference in frequency between the first frequency and the predetermined precession frequency of the free magnetic layer is less than two percent of the predetermined precession frequency of the free magnetic layer.

In another embodiment, the metallic bit line comprises Ruthenium or Rhodium.

In another embodiment, the metallic bit line comprises a layer of Ruthenium, the layer of Ruthenium being between 2 and 10 angstroms thick.

In another embodiment, the magnetization vector of the in-plane spin torque oscillator layer and the magnetization vector of the polarization magnetic layer are magnetically coupled.

In another embodiment, the programming voltage pulse comprises a direct voltage.

In another embodiment, the reference magnetic layer comprises CoFeB, the non-magnetic tunnel barrier layer comprises MgO, the free magnetic layer comprises CoFeB, the non-magnetic spacer comprises MgO, and the in-plane polarization magnetic layer comprises CoFeB.

In another embodiment, the in-plane spin torque oscillator layer comprises CoFeB and the perpendicular spin torque oscillator layer comprises CoFeB.

In another embodiment, the non-magnetic spin torque barrier layer comprises MgO.

In another embodiment, the free magnetic layer comprises CoFeB.

In another embodiment, the non-magnetic tunnel barrier layer comprises MgO.

In another embodiment, the in-plane polarization magnetic layer comprises CoFeB, Fe, FeV, or FeB.

In another embodiment, the in-plane polarization magnetic layer comprises CoFeB.

In another embodiment, the non-magnetic spacer comprises MgO.

In another embodiment, the magnetization vector of the polarization magnetic layer is fixed.

In another embodiment, a magnetic device includes a plurality of orthogonal spin transfer magnetic tunnel junctions (OST-MTJs) in a first plane. Each OST-MTJ comprises a reference magnetic layer, a non-magnetic tunnel barrier layer, a free magnetic layer, a non-magnetic spacer, and an in-plane polarization magnetic layer. The non-magnetic tunnel barrier layer is disposed over the reference magnetic layer. The reference magnetic layer has a magnetization vector that is perpendicular to the first plane and has a fixed magnetization direction. The free magnetic layer is disposed over the non-magnetic tunnel barrier layer. The free magnetic layer has a magnetization vector that is perpendicular to the first plane and has a magnetization direction that can switch from a first magnetization direction to a second magnetization direction and from the second magnetization direction to the first magnetization direction. The switching process involves precessions at a precession radius around an axis perpendicular to the first plane. The magnetization vector of the free magnetic layer has a predetermined precession frequency. The non-magnetic spacer is disposed over the free magnetic layer. The in-plane polarization magnetic layer is disposed over the non-magnetic spacer. The in-plane polarization magnetic layer has a magnetization vector that is parallel to the first plane. The magnetic device also includes a metallic bit line in a second plane. The metallic bit line is disposed over the plurality of OST-MTJs. The magnetic device also includes a spin torque nano oscillator (STNO) in a third plane and coupled to the metallic bit line. The STNO comprises an in-plane spin torque oscillator layer, a non-magnetic spin torque oscillator barrier layer, and a perpendicular spin torque oscillator layer. The in-plane spin torque oscillator layer is separated from the perpendicular spin torque oscillator layer by the non-magnetic spin torque oscillator barrier layer. The in-plane spin torque oscillator layer has a magnetization vector that precesses around an in-plane anisotropy axis or precesses in the third plane upon application of a programming voltage pulse. The perpendicular spin torque oscillator layer has a magnetization vector that precesses around an out-of-plane anisotropy axis upon application of the programming voltage pulse. Application of the programming voltage pulse to the magnetic device results in a switching current pulse. The switching current pulse alternates between a maximum current value and a minimum current value at a first frequency. Application of the switching current pulse to the in-plane polarization magnetic layer, the non-magnetic spacer, and the MTJ results in a spin-polarized current having spin-polarized electrons. The spin-polarized current alternates between a maximum spin-current value and a minimum spin-current value at the first frequency. The spin-polarized electrons exert a spin transfer torque on the magnetization vector of the free magnetic layer. The spin transfer torque alternates between a maximum magnitude and a minimum magnitude at the first frequency. The first frequency is synchronized with the predetermined precession frequency of the free magnetic layer, thereby causing the spin transfer torque to be at the maximum magnitude when the spin transfer torque increases the precession radius of the magnetization vector of the free magnetic layer, and at the minimum magnitude when the spin transfer torque decreases the precession radius of the magnetization vector of the free magnetic layer. In this way, the switching process of the free magnetic layer is improved from the first magnetization direction to the second magnetization direction and from the second magnetization direction to the first magnetization direction.

In another embodiment, the in-plane spin torque oscillator layer is disposed over the metallic spacer, the non-magnetic spin torque oscillator barrier layer is disposed over the in-plane spin torque oscillator layer, and the perpendicular spin torque oscillator layer is disposed over the non-magnetic spin torque oscillator barrier layer.

In another embodiment, the perpendicular spin torque oscillator layer is disposed over the non-magnetic spin torque oscillator barrier layer, the non-magnetic spin torque oscillator barrier layer is disposed over the perpendicular spin torque oscillator layer, and the in-plane spin torque oscillator layer is disposed over the metallic spacer.

In another embodiment, a magnetic device includes a plurality of reference magnetic layers in a first plane. Each reference magnetic layer has a magnetization vector that is perpendicular to the first plane and has a fixed magnetization direction. The magnetic device also includes a plurality of non-magnetic tunnel barrier layers in a second plane, each non-magnetic tunnel barrier layer disposed over one reference magnetic layer. The magnetic device also includes a plurality of free magnetic layers in a third plane, each free magnetic layer disposed over one non-magnetic tunnel barrier layer. Each free magnetic layer has a magnetization direction that can switch from a first magnetization direction to a second magnetization direction and from the second magnetization direction to the first magnetization direction. The switching process involves precessions at a precession radius around an axis perpendicular to the third plan. The magnetization vector of the free magnetic layer has a predetermined precession frequency. The plurality of reference magnetic layers, the plurality of non-magnetic tunnel barrier layers and the plurality of free magnetic layers form a plurality of magnetic tunnel junctions (MTJs). The magnetic device also includes a plurality of non-magnetic spacers in a fourth plane, each non-magnetic spacer disposed over one free magnetic layer. The magnetic device also includes a plurality of in-plane polarization magnetic layers in a fifth plane, each in-plane polarization magnetic layer disposed over one non-magnetic spacer. The in-plane polarization magnetic layer has a magnetization vector that is parallel to the fifth plane. The magnetic device also includes a metallic bit line in a sixth plane and disposed over the plurality of in-plane polarization magnetic layers. The magnetic device also includes an in-plane spin torque oscillator layer in a seventh plane and disposed over the metallic bit line. The in-plane spin torque oscillator layer has a magnetization vector that precesses around an in-plane anisotropy axis upon application of a programming voltage pulse. The magnetic device also includes a non-magnetic spin torque oscillator barrier layer in an eighth plane and disposed over the in-plane spin torque oscillator layer. The magnetic device also includes a perpendicular spin torque oscillator layer in a ninth plane and disposed over the non-magnetic spin torque oscillator barrier layer. The perpendicular spin torque oscillator layer has a magnetization vector that precesses around an out-of-plane anisotropy axis upon application of the programming voltage pulse. The in-plane spin torque oscillator layer, the non-magnetic spin torque oscillator barrier layer, and the perpendicular spin torque oscillator layer form a spin torque nano oscillator (STNO). Application of the programming voltage pulse to the magnetic device results in a switching voltage across the in-plane polarization magnetic layer, the non-magnetic spacer and the MTJ. The switching voltage oscillates between a maximum voltage value and a minimum voltage value at a first frequency. The first frequency is synchronized with the predetermined precession frequency of the free magnetic layer, thereby enhancing the efficiency of the switching process from the first magnetization direction to the second magnetization direction and from the second magnetization direction to the first magnetization direction. In this way, the switching process of the free magnetic layer is improved from the first magnetization direction to the second magnetization direction and from the second magnetization direction to the first magnetization direction.

In another embodiment, application of the switching voltage across the in-plane polarization magnetic layer, the non-magnetic spacer and the MTJ generates a spin-polarized current having spin-polarized electrons. The spin-polarized current alternates between a maximum spin-current value and a minimum spin-current value at the first frequency. The spin-polarized electrons exert a spin transfer torque on the magnetization vector of the free magnetic layer.

In another embodiment, the first frequency is synchronized with the predetermined precession frequency of the free magnetic layer, thereby causing the spin transfer torque to be at a maximum magnitude when the spin transfer torque increases the precession radius of the magnetization vector of the free magnetic layer, and at a minimum magnitude when the spin transfer torque decreases the precession radius of the magnetization vector of the free magnetic layer.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIG. 1 illustrates a conventional perpendicular MTJ stack with an in-plane polarizer for an MRAM device.

FIGS. 2a-2b illustrates the precession of the free layer in an MTJ.

FIGS. 4a-4b illustrates the precession of the free layer in an MTJ with a precessional spin current magnetic layer having a magnetization direction that rotates freely.

FIG. 5 illustrates an MTJ stack for an MRAM device having a precessional spin current magnetic layer.

FIGS. 11a-11b are graphs of simulations illustrating the improvement in performance of MTJ devices having an OST-MTJ structure, with an AC switching current injected from an STNO.

FIG. 12 illustrates an MRAM device utilizing a STNO connected to a plurality of OST-MTJ structures by a metallic bit line, where each OST-MTJ structure comprises an in-plane polarizing magnetic layer having a fixed magnetization direction, and a MTJ structure.

Figure 3:
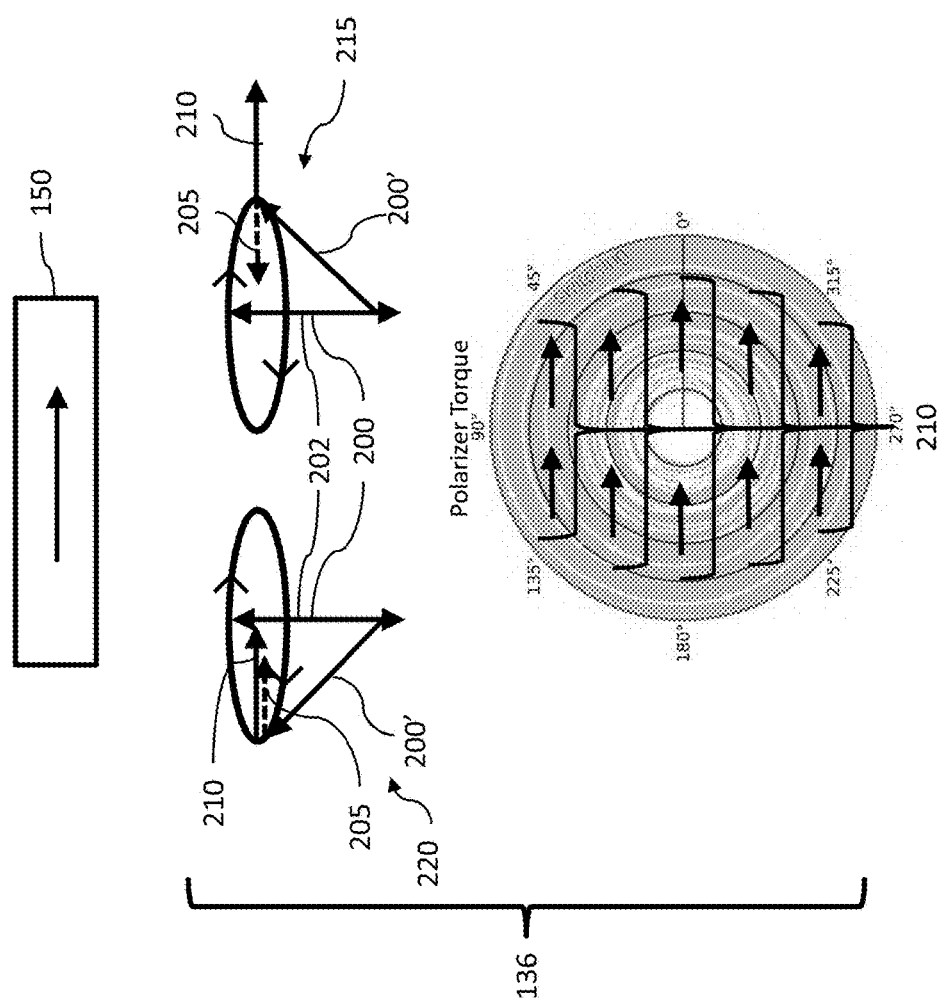
FIG. 3 illustrates the precession of the free layer in an MTJ used with a polarizing magnetic layer having a fixed magnetization direction.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use methods and magnetic devices that utilize a programming current comprising an alternating perturbation current to assist in the switching of a magnetization vector for a magnetic semiconductor device such as an MRAM device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

The present patent document discloses a MRAM device that uses a STNO, a metallic bit line, and a plurality of orthogonal spin transfer perpendicular MTJ (i.e., OST-MTJ) structures, each comprising an in-plane polarization layer having a fixed magnetization direction and a perpendicular MTJ. The MRAM device is described with reference to FIGS. 6-14. In one embodiment, application of a direct voltage (i.e., programming voltage) to the STNO generates a switching current pulse that oscillates between a maximum current value and a minimum current value at a first frequency. Application of this switching current pulse to a selected OST-MTJ structure generates a spin-polarized current having spin polarized electrons that alternates between a maximum spin-current value and a minimum spin-current value at a frequency determined by the structure and composition of the STNO (i.e., the first frequency). The spin-polarized electrons exert a spin transfer torque on the magnetization vector of the free magnetic layer of the selected OST-MTJ stack, thereby assisting in the switching of the magnetization direction of that free layer. In another embodiment, application of the programming voltage to the magnetic device results in a switching voltage across the selected OST-MTJ stack. The switching voltage oscillates between a maximum voltage value and a minimum voltage value at a first frequency. Application of the programming voltage to the in-plane polarization layer and MTJ generates a spin-polarized current having spin polarized electrons that alternates between a maximum spin-current value and a minimum spin-current value at the first frequency. The spin-polarized electrons exert a spin transfer torque on the magnetization vector of the free magnetic layer, thereby assisting in the switching of the magnetization direction of the free layer. In another embodiment, the first frequency is synchronized with the predetermined precession frequency of the magnetization vector of the free layer, such that the in-plane spin torque component provides a net benefit of assisting in the precessional motion of the magnetization vector, thereby enhancing the efficiency of the switching of the free layer.

Figure 6B:
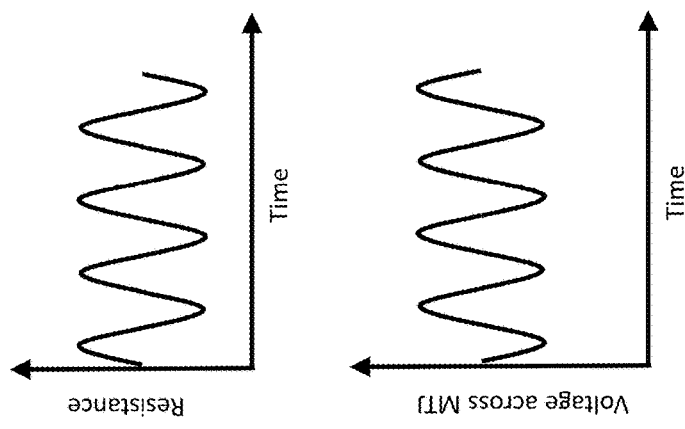
FIGS. 6a-6b illustrate the function of the STNO in converting the programming voltage pulse into a switching current pulse that oscillates between two current values.
Figure 6A:
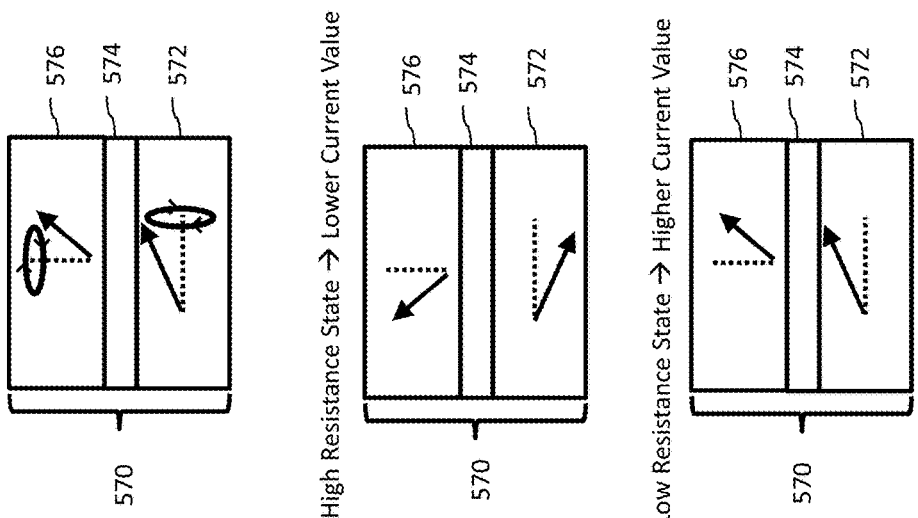

FIG. 6a shows a schematic for the magnetization dynamics of STNO 570. Although for purposes of illustration, the magnetization dynamics of the STNO and the free layer of the OST-MTJ are described with reference to an MRAM device having only one OST-MTJ structure (such as that shown in FIGS. 8 and 9), these dynamics are valid approximations of the magnetization dynamics found in an MRAM device having a plurality of OST-MTJ stacks, such as device 700 in FIG. 12. Application of the programming voltage to the magnetic device causes the magnetization vectors of the in-plane spin torque oscillator layer 572 and the perpendicular spin torque oscillator layer 576 to precess around their respective anisotropy axes, as shown on the top of FIG. 6a. The resistance across the STNO 570 is dependent on the relative orientation of the magnetization vectors of the in-plane spin torque oscillator layer 572 and the perpendicular spin torque oscillator layer 576. For example, when the two magnetization vectors are arranged in opposite orientations (as depicted in the middle of FIG. 6a), STNO 570 will possess a relatively high resistance value, compared to the relatively low resistance value possessed by the STNO when the two magnetization vectors are aligned (as depicted in the bottom of FIG. 6a). Thus, as the magnetization vectors of the in-plane spin torque oscillator layer 572 and the perpendicular spin torque oscillator layer 576 precess around their respective axes, STNO 570 alternates between a high resistance state and a low resistance state at a first frequency.

FIG. 6b depicts the effect of these precessional dynamics on the resistance across STNO 570 and the voltage across the in-plane polarization magnetic layer, the non-magnetic spacer, and the MTJ. As described above, the precessional dynamics of the magnetization vectors of the in-plane spin torque oscillator layer 572 and the perpendicular spin torque oscillator layer 576 cause the resistance across STNO 570 to oscillate between a high resistance state and a low resistance state (shown in the top graph of FIG. 6b) at the first frequency. As a result, the voltage across the metallic spacer 560, the in-plane polarization magnetic layer 550, the non-magnetic spacer 540, and the MTJ structure 530 (i.e., the switching voltage) oscillates between a high voltage value (corresponding to the time at which the resistance across the STNO 570 is at the minimum resistance value) and a low voltage value (corresponding to the time at which the resistance across the STNO 570 is at the maximum resistance value) at the same first frequency. The strength of the current leaving the STNO 570 and passing through the metallic spacer 560, the in-plane polarization magnetic layer 550, the non-magnetic spacer 540, and the MTJ structure 530 (i.e., the switching current) is directly proportional to the switching voltage. Therefore, the switching current alternates between a maximum current value and a minimum current value at the first frequency. In the case of magnetic device 700, after an OST-MTJ stack has been selected for writing, a switching current is generated in that selected OST-MTJ stack using a similar process.

In one embodiment, the programming voltage pulse is a direct voltage with a fixed voltage value. Upon being subjected to the alternating resistance states of the STNO 570, the resulting current leaving the STNO 570 and (i.e., the switching current) oscillates between a maximum current value and a minimum current value. In one embodiment, the frequency at which the oscillation occurs (i.e., the first frequency) is matched to the predetermined precession frequency of the magnetic vector of the free layer 536 while the precession frequency is near its maximum value. Thus, the switching current will oscillate between the maximum and minimum current values in a manner that is synchronized with the initial precessions of the magnetization vector of the free layer 536 (i.e., the predetermined precession frequency of the free layer 536, which is the frequency at which the magnetization vector of free layer 536 precesses when the vector is nearly perpendicular to the plane). However, later in the switching process, as the precession frequency of the free layer decreases (when the magnetization vector of the free layer 536 precesses near or in the plane), the predetermined precession frequency of the free layer 536 may fall out of phase with the first frequency.

As described above, when the switching current is applied to the in-plane polarization layer 550 and a perpendicular MTJ 530, a spin-polarized current is formed. As the switching current alternates between a maximum current value and a minimum current value, the spin-polarized current also alternates between a maximum spin-current value and a minimum spin-current value at the first frequency. In addition, the magnitude of the spin-transfer torque exerted on the free layer 536 is proportional to the spin-current value. Therefore, when the spin current is at the maximum spin-current value, the magnitude of the spin-transfer torque being exerted on the free layer 536 is at the maximum magnitude. When the spin current is at the minimum spin-current value, the magnitude of the spin-transfer torque being exerted on the free layer 536 is at the minimum magnitude. Therefore, in embodiments where the first frequency in synchronized with the predetermined precession frequency of the magnetization vector of the free layer 536, the magnitude of the spin transfer torque will oscillate between the maximum magnitude and minimum magnitude at a frequency that is synchronized with the precession of the free layer 536 (i.e., the first frequency).

Figure 7A:
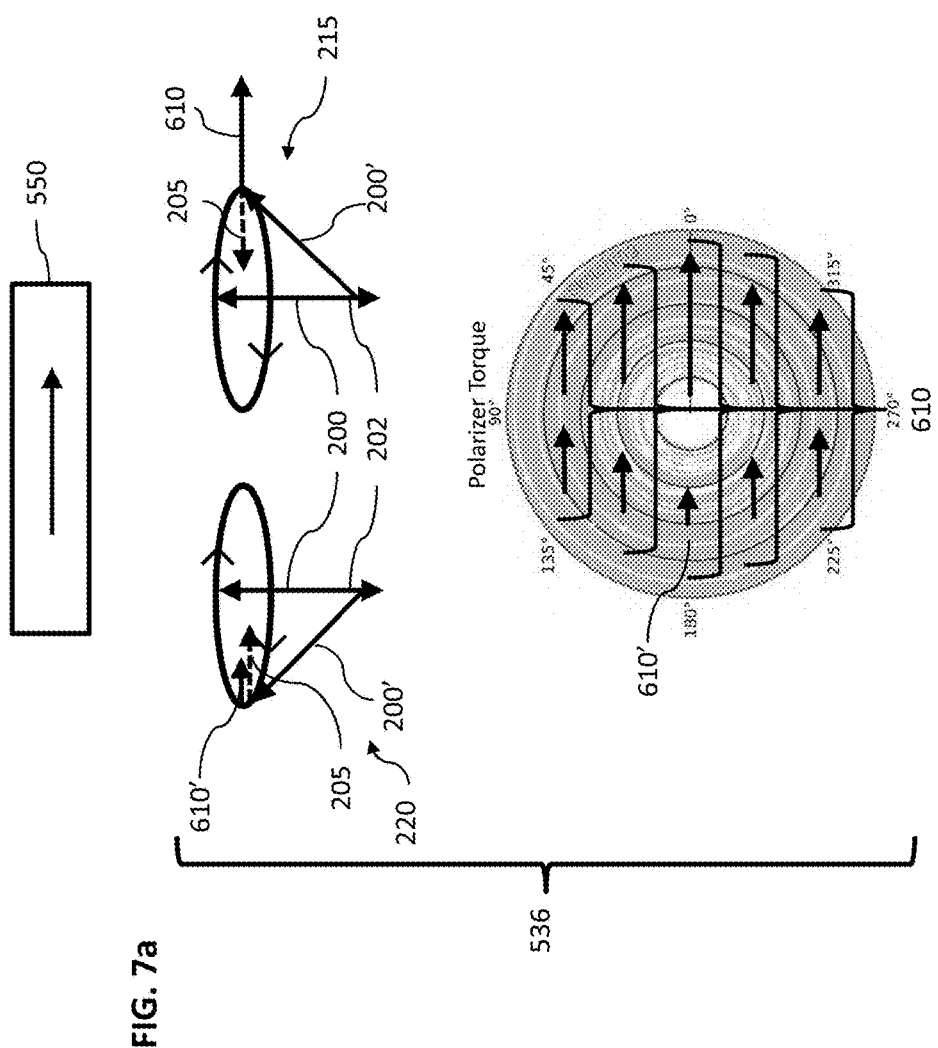
FIGS. 7a-7b illustrates the precession of the free layer in an MTJ with a polarizer magnetic layer having a fixed magnetization direction that utilizes a programming current pulse that is generated by applying a constant voltage across an MRAM device comprising an STNO and an orthogonal spin transfer perpendicular MTJ (OST-MTJ) structure that comprises an in-plane polarizing magnetic layer having a fixed magnetization direction and a perpendicular MTJ.
Figure 7B:
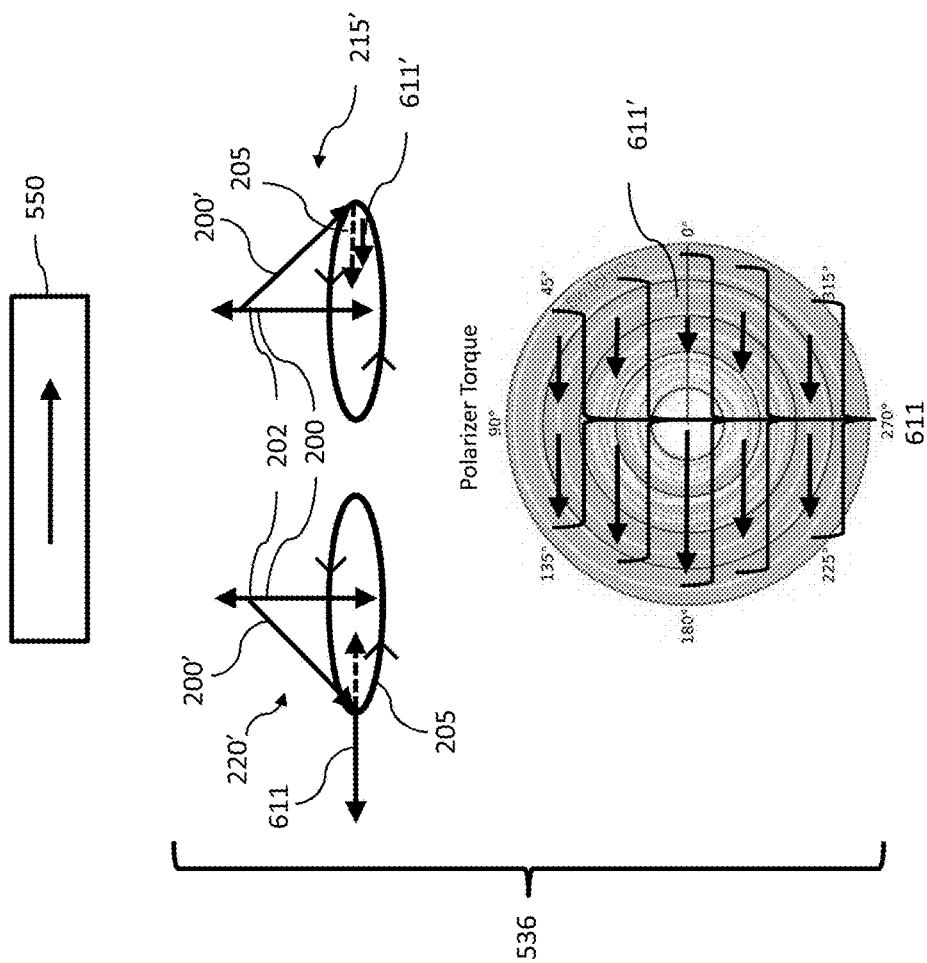

FIGS. 7a and 7b show the concept behind devices that utilize a STNO 570, an in-plane polarization layer 550, and a MTJ structure 530. Again, similar magnetization dynamics occur when switching free layer 736 during the process of writing a selected OST-MTJ stack 730' in MRAM device 700 (see FIG. 12). The magnetization dynamics depicted in FIGS. 7a and 7b are approximations of the dynamics that occur during the initial stages of switching the magnetization vector of free layer 536 (i.e., when the polar angle between axis 200 and magnetic vector 200' is small). At larger magnetization polar angles (i.e., more than 10 degrees from equilibrium), the dynamics presented in these figures no longer provide an accurate depiction of the magnetization dynamics of the free layer. Nevertheless, the precessional dynamics that occur at low magnetization polar angles are to a great extent determinative of the switching process and are therefore useful in understanding the disclosures herein.

Like the in-plane polarizer 150 previously discussed, the in-plane polarization layer 550 in this embodiment has a magnetic vector with a fixed magnetization direction (top of FIG. 7a). The free layer 536 in this embodiment is similar to the free layer 136 previously discussed, in that it has an inherent damping characteristic 205 that can be overcome with the assistance of spin transfer torque. As seen in the middle of FIG. 7a, the in-plane spin transfer torque 610 causes the magnetization direction 200' of the free layer 536 to precess in a cone-like manner around an axis 202 perpendicular to the plane of the layers. FIG. 7a shows a progression of rotation of the magnetic direction 200' about axis 202. As discussed, when a spin polarized current traverses the device, the magnetization of the free layer 536 precesses in a continuous manner (i.e., it turns on itself in a continuous manner as shown in the middle of FIG. 7a) with maintained oscillations until the magnetic direction of free layer 536 is opposite the magnetic direction prior to the spin torque causing precession, i.e., the magnetic direction of free layer 136 switches by 180 degrees.

The spin-polarized electrons of the spin-polarized current exert a spin transfer torque on the magnetization layer of the free layer. This spin transfer torque has both an in-plane spin torque component 610 and a perpendicular spin torque component (not shown in FIG. 7a). The perpendicular spin torque exerts a force on the magnetization vector of the free layer that pulls the magnetization vector from one perpendicular position to the other perpendicular position (e.g., from the parallel to the anti-parallel state). This perpendicular spin torque component is caused by spin-polarization of the electrons by the reference magnetic layer 532 (depicted in FIG. 8). The in-plane spin torque 610 assists in the switching of the free layer by providing a force that pushes the magnetization vector away from the perpendicular axis 202, allowing the perpendicular spin transfer torque to act on the magnetization vector, thereby switching the free layer. This in-plane spin torque 610 is caused by spin-polarization of the electrons by the in-plane polarization magnetic layer 550.

The in-plane spin torque 610 also enhances the precessional motion of the magnetization vector of the free layer. As seen on the right-hand side of FIG. 7a, the spin-polarized electrons provide in-plane spin torque 610 that helps to overcome the damping 205 in the first half of the precession 215 because the in-plane spin torque 610 provided by the spin-polarized current is opposite that of the inherent damping 205 of the free layer 536. During the first half of the precession, the spin-polarized current is at or near the maximum current value, thereby imparting in-plane spin transfer torque 610 at or near the maximum spin-torque magnitude (depicted by the longer arrow). As previously discussed, during the second half of the precession 215, this in-plane spin torque 610' is actually aligned with the inherent damping of the free layer 536. However, in one embodiment, during the second half of the precession, the spin-polarized current is at or near the minimum current value, thereby imparting in-plane spin transfer torque 610' at or near the minimum spin-torque magnitude (depicted by the shorter arrow). The frequency at which the switching current alternates between its maximum current value and its minimum current value is set at a first frequency, which is defined by the composition and structure of the STNO 570. The first frequency is set to be synchronized with the predetermined precession frequency of the free layer. Therefore, the magnitude of the in-plane spin transfer torque is maximized (FIG. 7a, 610) when it enhances the precessional motion of the free layer and is minimized (FIG. 7a, 610') when the in-plane spin transfer torque opposes the precessional motion (bottom of FIG. 7a). Thus, the in-plane spin torque component provides a net benefit of assisting in the precessional motion of the magnetization vector, thereby enhancing the efficiency of the switching of the free layer.

Moreover, as shown in FIG. 7b, the use of a magnetic device 500 that comprises STNO 570, in-plane polarization magnetic layer 550 and MTJ structure 530 can provide a net enhancement to the precession throughout the switching process of the free layer 536 from both the first magnetization direction and the second magnetization direction (i.e., switching of the free layer from both the parallel direction to the antiparallel direction and from the antiparallel direction to the parallel direction). During switching of the free layer 536 from the second magnetic direction to the first magnetic direction, it is the reflected spin current generated by the in-plane polarizer that exerts the in-plane spin transfer torque 611 on the free layer 536. As discussed above, the direction of the in-plane spin transfer torque 611 exerted by the reflected spin current is antiparallel to the magnetic direction of the in-plane polarizer 550 (top of FIG. 7b). Nevertheless, the first frequency can be synchronized with the predetermined precession frequency of the magnetization vector 200' of the free magnetic layer in such a way as to maximize the in-plane spin transfer torque 611 when it opposes the damping force 205 and minimize the in-plane spin transfer torque 611' when it enhances the damping force 205 (middle of FIG. 7b). Thus, synchronization of the oscillation frequency of the STNO (i.e., the first frequency) with the precession frequency of the free layer can be accomplished regardless of the direction of the current, achieving a net enhancement of the precessional motion during switching of free layer 536 in both directions. Similar advantages can be obtained using an MRAM device, such as device 700 in FIG. 12, that includes a plurality of OST-MTJ stacks connected to an STNO by a metallic bit line.

Figure 8:
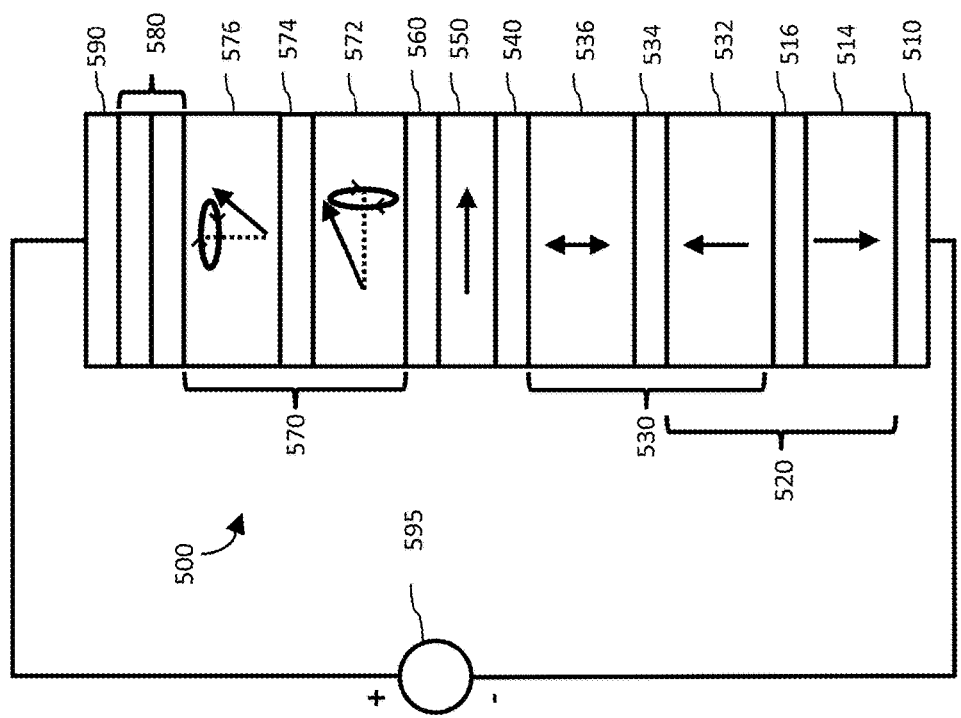
FIG. 8 illustrates an MTJ stack for an MRAM device that utilizes an STNO and an OST-MTJ structure.

FIG. 8 shows a memory cell 500 with a OST-MTJ (comprising an in-plane polarization layer 550, a MTJ structure 530), and a STNO structure 570 The OST-MTJ structure comprises at least a reference layer 532, a tunneling barrier layer 540, a free layer 536, a non-magnetic spacer 540, and an in-plane polarization layer 550. As shown in FIG. 8, the reference layer 532 of MTJ 530 has a magnetization direction that is preferably perpendicular to its plane, although variations of a several degrees are within the scope of what is considered perpendicular. As also seen in FIG. 8, free layer 536 also has a magnetization vector that is preferably perpendicular to its plane, but its direction can vary by 180 degrees. A nonmagnetic spacer 540 is disposed over free layer 536. In-plane polarization magnetic layer 550 is disposed over nonmagnetic spacer 540. In-plane polarization magnetic layer 550 has a magnetization vector having a magnetic direction parallel to its plane. In-plane polarization magnetic layer 550 has a magnetization direction that is preferably parallel to its plane, although variations of a several degrees are within the scope of what is considered parallel. Metallic spacer 560 is disposed over the OST-MTJ structure. STNO 570 is deposited over metallic spacer 560. STNO 570 includes in-plane spin torque oscillator layer 572, a non-magnetic spin torque oscillator barrier layer 574, and a perpendicular spin torque oscillator layer 576. As shown in FIG. 12, the magnetization vector of in-plane spin torque oscillator layer 572, has a magnetization direction that precesses around an anisotropy axis that is parallel to the plane, although variations of a several degrees are within the scope of what is considered parallel. In some embodiments, the magnetic direction of the in-plane spin torque oscillator layer precesses in the plane if the in-plane anisotropy is weak. As also seen in FIG. 8, the perpendicular spin torque oscillator layer 576 has a magnetization vector magnetization direction that precesses around an anisotropy axis that is perpendicular to the plane, although variations of a several degrees are within the scope of what is considered perpendicular. In one embodiment, voltage source 595 generates a direct voltage.

Figure 9:
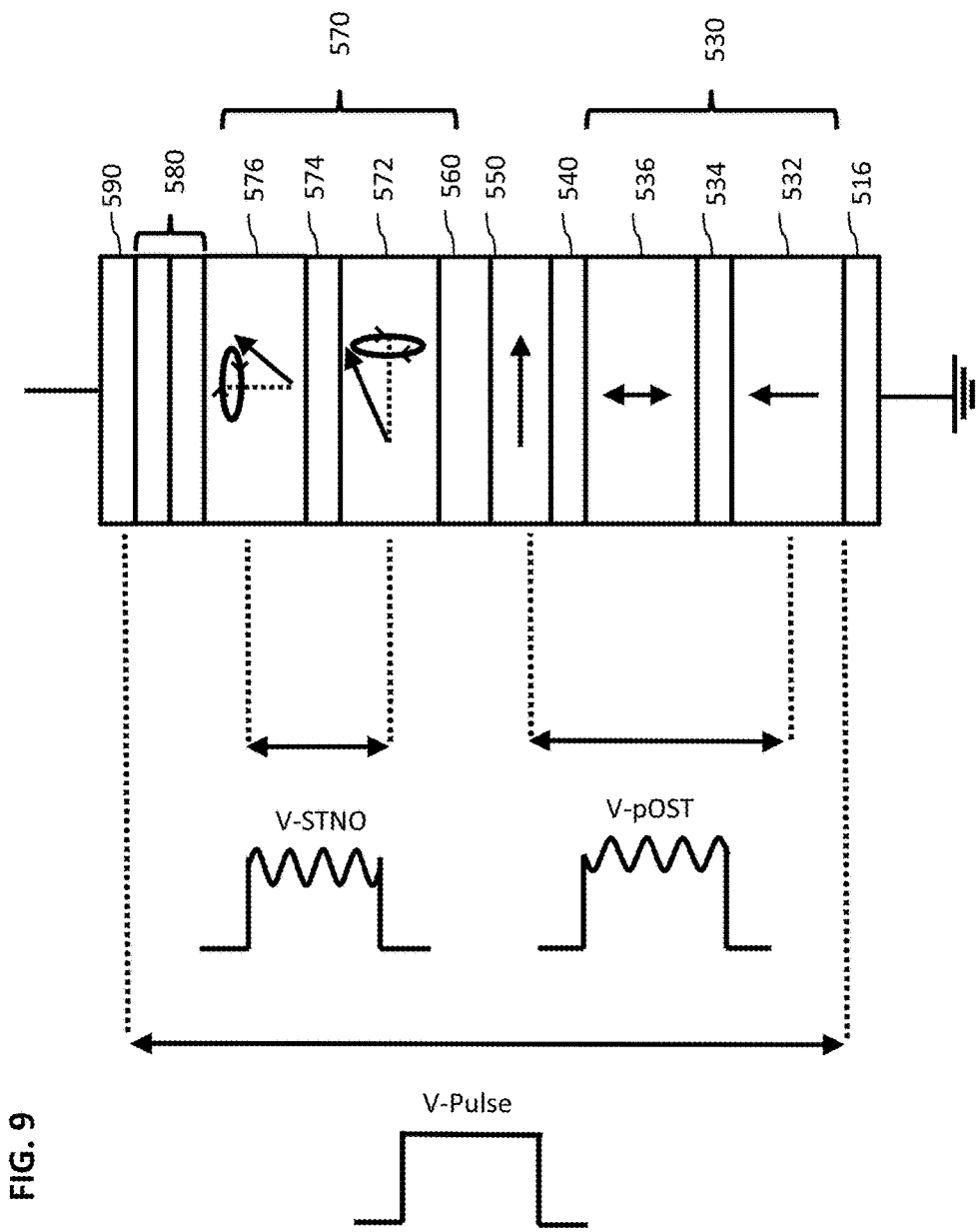
FIG. 9 illustrates the voltage across a magnetic device that utilizes an STNO and an OST-MTJ structure.

FIG. 9 depicts the voltage across the magnetic device 500, which comprises STNO 570, in-plane polarization layer 550, and MTJ structure 530. As the programming current pulse flows through device 500, the programming current pulse initiates the precessional dynamics of the magnetic vectors of the STNO 570. As discussed above, this causes the resistance across STNO 570 to oscillate between a high resistance state and a low resistance state at a first frequency. In one embodiment, the voltage across the entire device (labeled a V-Pulse) is fixed and constant. V-STNO oscillates between a maximum voltage value and a minimum voltage value at the first frequency due to the oscillating resistance value of STNO 770. Metallic spacer 560 is comprised of a highly-conductive material, such as a metallic material. Therefore, the output voltage from STNO 570 is essentially equivalent to the input voltage for the V-pOST. Accordingly, V-pOST also oscillates between a maximum voltage value and a minimum voltage value at the first frequency, thereby causing the current flowing through the OST-MTJ structure (i.e., the switching current) to alternate between a maximum current value and a minimum current value at the first frequency.

Figure 10:
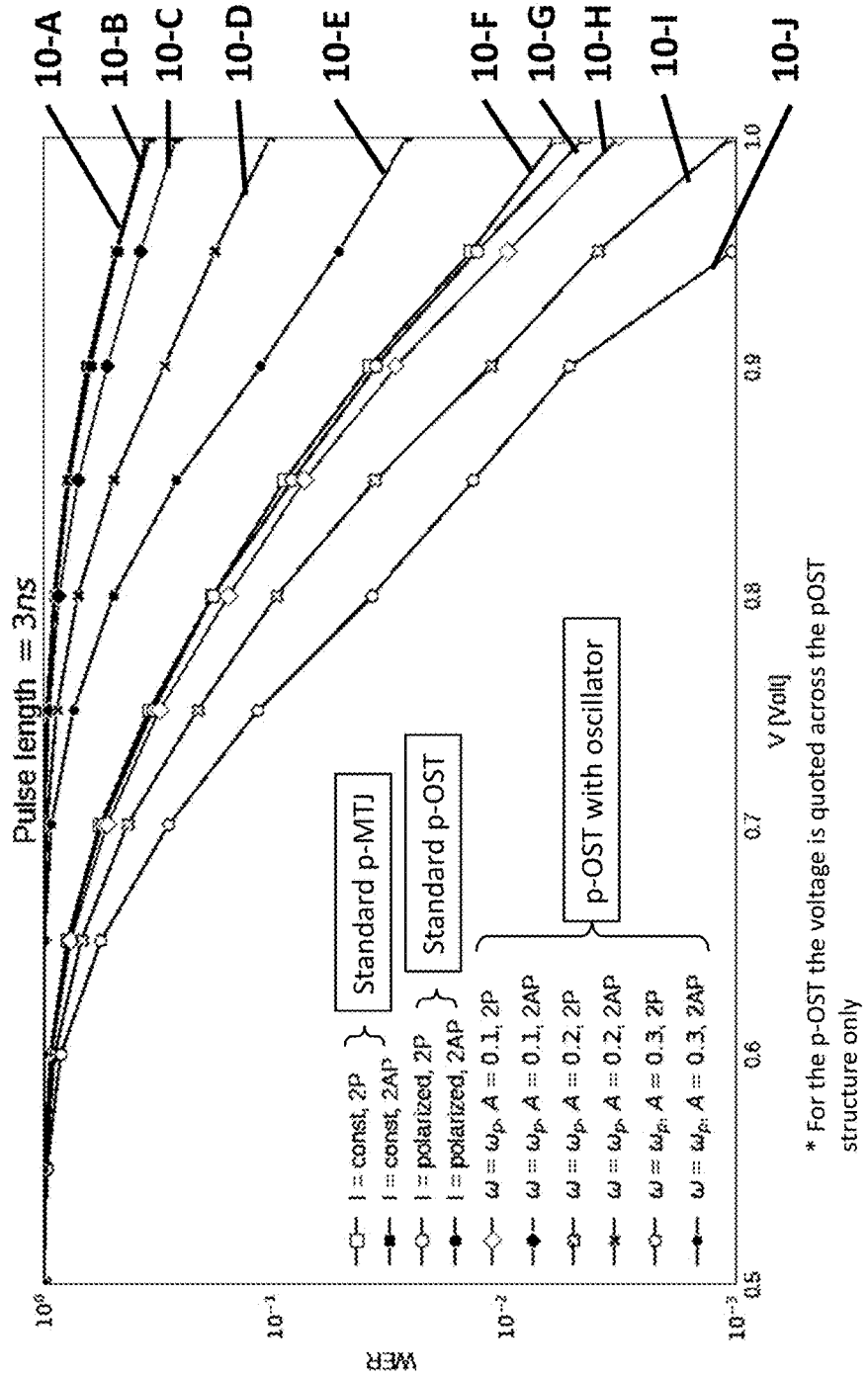
FIG. 10 is a graph of several simulations illustrating the improvement in performance of MTJ devices having an OST-MTJ structure, with an AC switching current injected from an STNO.

The results of several simulations that model the structures described herein are seen in FIG. 10. The X axis of the graph is the voltage of the programming pulse that was applied to the device. The Y axis is the write error rate (WER), which is indicative of the how easily the magnetization vector of the free layer switches from the first magnetization direction to the second magnetization direction or from the second magnetization direction to the first magnetization direction; the lower the WER, the more effective the applied current is at switching the free layer. The graph depicts two series of transitions: (1) switching the free layer from the parallel direction to the antiparallel direction (filled data points, indicated by "2AP" on the legend); and (2) switching the free layer from the antiparallel direction to the parallel direction (unfilled data points, indicated by "2P" on the legends.) To simulate a device comprising an STNO, an in-plane polarizer, and an MTJ, a switching current was used that comprised a direct current with a fixed value and an alternating perturbation current superimposed on the direct current. During the writing process of magnetic device 700 that comprises a STNO 770, a metallic bit line 760 and a plurality of OST-MTJ structures 730', a similar process occurs. Thus, these results demonstrate the significant improvement provided by the various embodiments described herein. Within each series, different sets of simulations were run, with the perturbation amplitude of the alternating current frequency set to 0%, 10%, 20%, and 30% of the direct current voltage (depicted on the legend as "polarized"; "A=0.1"; "A=0.2"; and "A=0.3", respectively). In each of the simulations, the alternating perturbation frequency ($\omega$) is synchronized with the predetermined precession frequency of the free layer ($\omega_{p_1}$) and the alternating perturbation current is applied to the free layer for a pulse length of 3 ns.

For the first series of simulations (switching from the parallel to anti-parallel directions), both the constant non-polarized current (line 10-A with filled squares) and the constant polarized current (line 10-B with filled circles) had a similar effect on the switching of the free layer. The data show that application of an alternating perturbation current causes a reduction in switching Voltage values for the system, with the switching Voltage values decreasing as the perturbation amplitude increases. This effect can be seen by comparing the lines for the currents with 0% perturbation amplitude (line 10-B with filled circles); 10% perturbation amplitude (line 10-C with filled diamonds), 20% perturbation amplitude (line 10-D with filled crosses); and 30% perturbation amplitude (line 10-E with filled pentagons). The lines that correspond to higher values of the perturbation amplitude lie below the lines with lower values of the perturbation amplitude, suggesting that increasing the perturbation amplitudes reduces the WER, i.e., it reduces the probability that a bit is written incorrectly.

Similar results were obtained in the second series of experiments (switching from the anti-parallel to the parallel direction). No significant change in switching voltage was observed between the constant non-polarized current (line 10-F with empty squares) and the constant polarized current (line 10-G with empty circles). However, the switching voltage values decrease as the perturbation amplitude increases, as can be observed by comparing the lines with 0% perturbation amplitude (line 10-G with empty circles); 10% perturbation amplitude (line 10-H with empty diamonds), 20% perturbation amplitude (line 10-I with empty crosses); and 30% perturbation amplitude (line 10-J with empty pentagons), respectively. The lines that correspond to higher perturbation amplitude lie below the lines with smaller perturbation amplitude.

Thus, the results in FIG. 10 demonstrate improved switching with the use of a magnetic device comprising a STNO, an in-plane polarizer and a MTJ when the oscillating impedance frequency of the STNO is synchronized with the predetermined precession frequency of the free layer, thereby demonstrating the significant improvement provided by the various embodiments described herein. In general, the voltage required to switch the magnetization vector from the anti-parallel direction to the parallel direction was considerably less than that required to switch the magnetization vector from the parallel direction to the anti-parallel direction. Moreover, while the use of an alternating perturbation current effectively reduces the switching voltage value for switching in both directions, this effect is more pronounced for switching from the parallel to the antiparallel direction because the spin-polarization efficiency from the in-plane polarizing layer to the free layer is higher in this case.

Detailed results from a subset of the simulations from FIG. 10, which simulate a device having the structure described herein, are seen in FIGS. 11a-11b. In FIGS. 11a-11b, the Y axis is the magnetization in the Z axis of the magnetization vector of a free layer from −1.0 to +1.0 in a simulation modeling a magnetic device such as device 500. The X axis shows the amount of time it takes with switch the magnetization direction of free layer 536 a full 180 degrees. In the simulations, the oscillation frequency of the switching current (i.e., the first frequency) is matched to the precessional frequency of free layer 536. The amplitude of the perturbations is 20% of the mean voltage value (i.e., the programming voltage). FIG. 11a depicts switching from the parallel to antiparallel directions at a voltage value of 0.95 volts. FIG. 11b depicts switching from the antiparallel to the parallel direction at a voltage value of −0.8 volts.

FIG. 12 depicts a magnetic device 700 with an STNO 770 that is connected to a plurality of OST-MTJ structures 730' by a metallic bit line 760. As seen in FIG. 12, each magnetic device has a plurality of OST-MTJ structures 730'. Each OST-MTJ structure 730' includes one or more seed layers 710 provided at the bottom of stack 730' to initiate a desired crystalline growth in the above-deposited layers. Synthetic antiferromagnetic (SAF) layer 720 is disposed over seed layer 710. SAF layer 720 is comprised of a first SAF layer 732, anti-ferromagnetic coupling layer 716 and second SAF layer 714. Second SAF layer 714 is deposited over seed layer 710, while anti-ferromagnetic coupling layer 716 is placed over second SAF layer 714. MTJ 730 is deposited over anti-ferromagnetic coupling layer 716. OST-MTJ 730 includes first SAF layer 732, which acts as the reference layer of the MTJ, and is also part of SAF layer 720. A tunneling barrier layer (i.e., the insulator) 734 is disposed over first SAF layer 732 while the free layer 736 is disposed over tunneling barrier layer 734. As shown in FIG. 12, the magnetization vector of first SAF layer 732 has a magnetization direction that is preferably perpendicular to its plane, although variations of a several degrees are within the scope of what is considered perpendicular. As also seen in FIG. 12, free layer 736 also has a magnetization vector that is preferably perpendicular to its plane, but its direction can vary by 180 degrees. A nonmagnetic spacer 740 is disposed over free layer 736. In-plane polarization magnetic layer 750 is disposed over nonmagnetic spacer 740. In one embodiment, in-plane polarization magnetic layer 750 has a magnetization vector having a magnetic direction parallel to its plane, and is perpendicular to the magnetic vector of the reference layer 732 and free layer 736. In-plane polarization magnetic layer 750 has a magnetization direction that is preferably parallel to its plane, although variations of a several degrees are within the scope of what is considered parallel. Each OST-MTJ structure comprises at least a reference layer 732, a tunneling barrier layer 740, a free layer 736, a non-magnetic spacer 740, and an in-plane polarization layer 750. Metallic bit line 760 is disposed over the plurality of OST-MTJ structures 730'. STNO 570 is deposited over metallic bit line 760. STNO 770 includes in-plane spin torque oscillator layer 772, is disposed over magnetic spacer 760. A non-magnetic spin torque oscillator barrier layer 774 is disposed over in-plane spin torque oscillator layer 772 while a perpendicular spin torque oscillator layer 776 is disposed over non-magnetic spin torque oscillator barrier layer 774. As shown in FIG. 12, the magnetization vector of in-plane spin torque oscillator layer 772, has a magnetization direction that precesses around an anisotropy axis that is parallel to the plane, although variations of a several degrees are within the scope of what is considered parallel. In some embodiments, the magnetic direction of the in-plane spin torque oscillator layer precesses in the plane if the in-plane anisotropy is weak. As also seen in FIG. 12, the perpendicular spin torque oscillator layer 776 has a magnetization vector magnetization direction that precesses around an anisotropy axis that is perpendicular to the plane, although variations of a several degrees are within the scope of what is considered perpendicular. One or more capping layers 780 can be provided on top of perpendicular spin torque oscillator layer 776 to protect the layers below. In one embodiment, voltage source 785 generates a direct voltage. Each OST-MTJ stack 730' is connected to a transistor 705. Each transistor 705 can be used as a switch, specifically directing a voltage across the OST-MTJ stack to which it is coupled. Thus, a specific OST-MTJ stack can be selected for writing by switching its corresponding transistor (e.g., transistor 705') such that the programming voltage is generated across the specified OST-MTJ stack.

Seed layer 710 in the MTJ structure shown in FIG. 12 preferably comprises Ta, TaN, Cr, Cu, CuN, Ni, Fe or alloys thereof. Second SAF layer 714 preferably comprises either a Co/Ni, Co/Pt or Co/Pd multilayer structure. First SAF layer 732 preferably comprises either a Co/Ni or Co/Pt multilayer structure plus a thin non-magnetic layer comprised of tantalum having a thickness of two to five Angstroms and a thin CoFeB layer (0.5 to three nanometers). Anti-ferromagnetic coupling layer 716 is preferably made from Ru having thickness in the range of three to ten Angstroms. Tunneling barrier layer 734 is preferably made of an insulating material such as MgO, with a thickness of approximately ten Angstroms. Free layer 736 is preferably made with CoFeB deposited on top of tunneling barrier layer 734. Free layer 736 can also have layers of Fe, Co, Ni or alloys thereof and W and Ta insertion layers to promote perpendicular anisotropy. Spacer layer 740 over MTJ 730 can be any non-magnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms MgO layer, or or 2-20 Angstroms $Al_2O_3$ layer.

Nonmagnetic spacer 740 has a number of properties. For example, nonmagnetic spacer 740 physically separates the free layer 736 and the in-plane polarization magnetic layer 750. Nonmagnetic spacer 740 transmits spin current efficiently from the in-plane polarization magnetic layer 750 into the free layer 736 because it preferably has a long spin diffusion length if made metallic. Nonmagnetic spacer 740 also promotes good microstructure and high tunneling magnetoresistance (TMR) and helps keep the damping constant of the free layer 736 low. In one embodiment, the nonmagnetic spacer 740 comprises MgO.

The in-plane polarization magnetic layer 750 is preferably made from CoFeB. The in-plane polarization magnetic layer 750 can also be made with CoFeB, Fe, FeV. or FeB. It can also be made with Co, Fe, Ni magnetic layers or can be made out of their alloys. The magnetic alloys can also have boron, tantalum, copper or other materials.

Metallic bit line 760 has a number of properties. For example, metallic spacer 760 physically separates the STNO 770 from the in-plane polarization magnetic layers 750 of the plurality of OST-MTJ structures 730'. Metallic bit line 760 also connects the STNO 770 to the plurality of OST-MTJ structures 730', such that a voltage can be applied across the STNO 770 and a selected OST-MTJ structure 730' during the writing process. Preferably, metallic bit line 760 is composed of ruthenium or rhodium. Metallic bit line 760 is preferably made from Ru having thickness in the range of two to ten Angstroms or Rh having thickness in the range of two to ten Angstroms. In one embodiment, when metallic bit line 760 is comprised of a thin layer of Ru (e.g., 7 Angstroms), the in-plane polarization magnetic layer 750 of the OST-MTJ structure closest to the STNO 770 and the in-plane spin torque oscillator layer 772 can be AFM coupled via stray fields, thereby minimizing the stray field that in-plane polarization magnetic layer 750 imparts on free magnetic layer 736. This AFM coupling can be strengthened via electronic oscillatory (RKKY) coupling.

The STNO 770 can be in either of the following configurations: (1) in-plane spin torque oscillator layer 772 disposed over spin torque oscillator barrier layer 774, which is disposed over perpendicular spin torque oscillator layer 776; or (2) perpendicular spin torque oscillator layer 776 disposed over spin torque oscillator barrier layer 774, which is disposed over in-plane spin torque oscillator layer 772. In-plane spin torque oscillator layer 772 can be comprised of a SAF, such as a composite ferromagnetic metal/metallic spacer (Ru or Rd)/ferromagnetic metal structure. The in-plane spin torque oscillator layer can be pinned by a 5-10 nm layer of PtMn Exchange bias layer. Preferably, in-plane spin torque oscillator layer 772 comprises CoFeB. Spin torque oscillator barrier layer 774 can be any non-magnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms MgO layer, or 2-20 Angstroms $Al_2O_3$ layer. Spin torque oscillator barrier layer 774 is preferably made from MgO. The perpendicular spin torque oscillator layer 776 can comprise 6-16 Angstroms of Ta/CoFeB. Preferably, the perpendicular spin torque oscillator layer 776 comprises CoFeB. Finally, capping layer 780 can be any material that provides good interface to the in-plane layer such as Ta, TaN, Ru, MgO, Cu, etc.

In some embodiments, voltage source 785 can generate a programming voltage pulse that comprises direct voltage pulse. In other embodiments, the strength of the bias produced by voltage source 785 can vary over time. Transistor 705 can have any appropriate transistor structure, such as, for example, a bipolar transistor construction. In some embodiments, transistor 705 acts as a switch, specifically directing the programming voltage across the OST-MTJ stack to which it is coupled. In some embodiments, transistor 705 prevents a switching current from being generated in more than one OST-MTJ stack at any given time.

Figure 13:
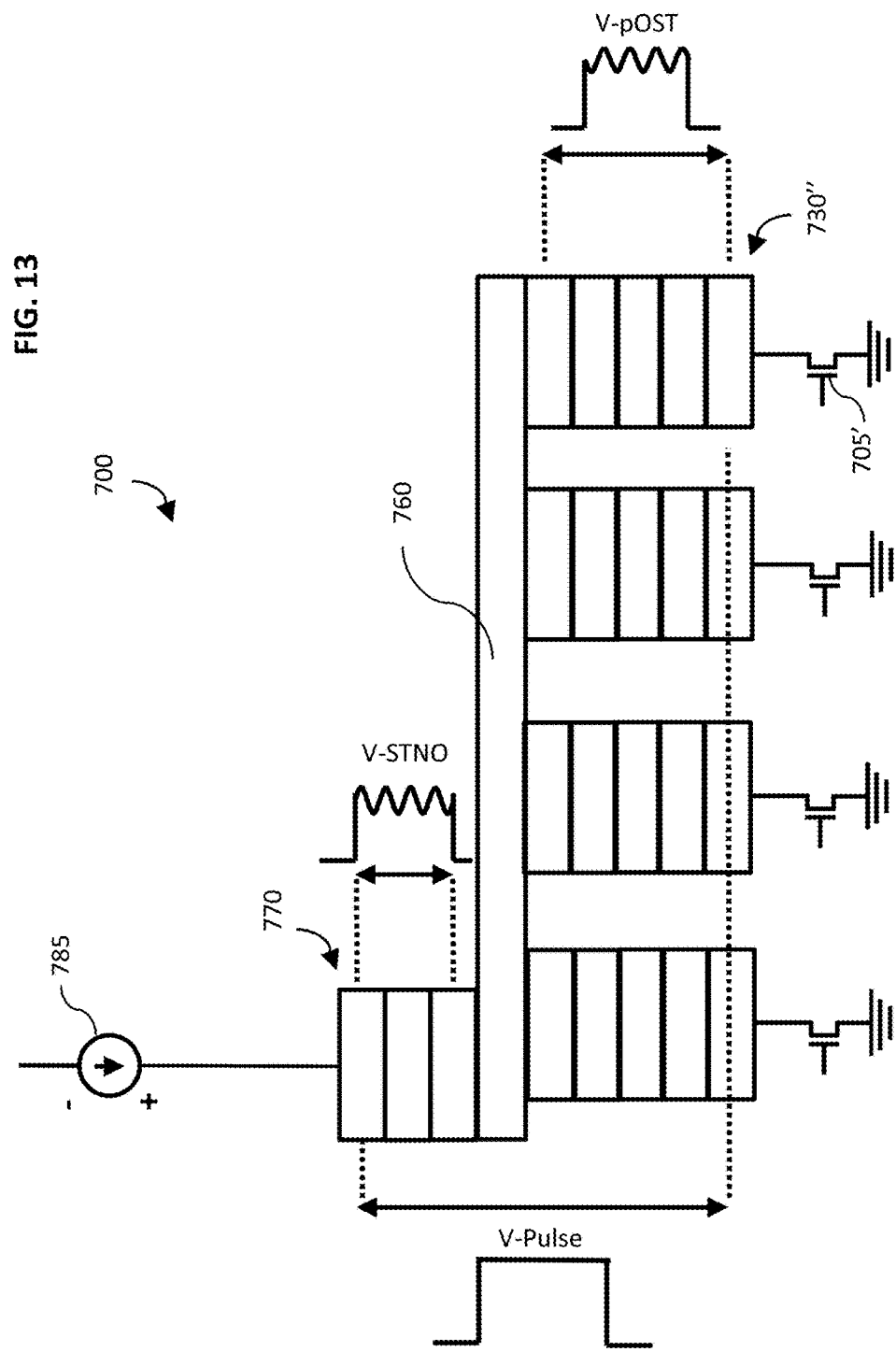
FIG. 13 illustrates the voltage across an MRAM device utilizing a STNO connected to a plurality of OST-MTJ structures by a metallic bit line, where each OST-MTJ structure comprises an in-plane polarizing magnetic layer having a fixed magnetization direction, and a MTJ structure.

FIG. 13 depicts the voltage across the magnetic device 700, which comprises STNO 770 and a plurality of OST-MTJ structures 730', connected by metallic bit line 760. One of the OST-MTJ stacks is selected for writing (e.g., OST-MTJ stack 730") using corresponding transistor 705'. This, in turn, enables the voltage generator 785 to create a voltage across the STNO 770, the metallic bit line 760, and the selected OST-MTJ structure 730". In FIG. 13, the farthest OST-MTJ stack to the right, OST-MTJ structure 730" has been selected for writing. As the programming current pulse flows through device 700, the programming current pulse initiates the precessional dynamics of the magnetic vectors of the STNO 770. As discussed above, this causes the resistance across STNO 770 to oscillate between a high resistance state and a low resistance state at a first frequency.

In one embodiment, magnetic device 700 operates as a voltage divider (when supplied with a constant voltage pulse), with a first voltage across STNO 770 (labeled as V-STNO in FIG. 13) and a second voltage across the selected OST-MTJ structure 730" (labeled as V-pOST in FIG. 13). In one embodiment, the voltage across the entire device (labeled a V-Pulse) is fixed and constant. V-STNO oscillates between a maximum voltage value and a minimum voltage value at the first frequency due to the oscillating resistance value of STNO 770. Metallic bit line 760 is comprised of a highly-conductive material, such as a metallic material. Therefore, the output voltage from STNO 770 is essentially equivalent to the input voltage for the V-pOST. Accordingly, V-pOST also oscillates between a maximum voltage value and a minimum voltage value at the first frequency. Moreover, the strength of the current flowing out of STNO 770 and passing through the selected OST-MTJ structure 730" (i.e., the switching current) is directly proportional to the voltage value of V-pOST. Thus, the switching current alternates between a maximum current value and a minimum current value at the first frequency.

The manner in which a bit is written using magnetic device 700 that comprises STNO 770, metallic bit line 760 and a plurality of OST-MTJ structures 730' will now be described. First, a particular OST-MTJ stack (such as OST-MTJ stack 730" in FIG. 13) is selected for writing. In some embodiments, this selection is enabled by the presence of transistor 705, which can be selectively activated (e.g., transistor 705' in FIG. 13), thereby allowing a voltage to be applied across the selected OST-MTJ stack 730" to which the transistor is coupled. Next, an electrical voltage is supplied, for example, by voltage source 785, which results in an electrical current (i.e., the programming current) through the perpendicular spin torque oscillator layer 776, the non-magnetic spin torque barrier layer 774, the in-plane spin torque oscillator layer 772, the magnetic bit line 760, and the various layers of the selected OST-MTJ stock 730" (e.g., the in-plane polarization magnetic layer 750, the non-magnetic spacer 740, the free magnetic layer 736, the non-magnetic tunneling barrier layer 734, and the reference layer 732). Application of the programming voltage to STNO 770 causes the magnetization vectors of the perpendicular spin torque oscillator layer 776 and the in-plane spin torque oscillator layer 772 to precess around their respective axes. The precession of the magnetic vectors perpendicular spin torque oscillator layer 776 and the in-plane spin torque oscillator layer 772 causes the resistance across the STNO to oscillate between a maximum resistance value and a minimum resistance value. The net effect is that the current leaving the STNO and passing through the in-plane polarization magnetic layer 750 of the selected OST-MTJ stack 730" (i.e., the switching current) alternates between a maximum current value and a minimum current value at a first frequency.

Application of the switching current to the selected OST-MTJ stack 730" (in particular, in-plane polarization layer 750, free layer 736 and reference layer 732) creates a spin polarized current that passes through non-magnetic spacer layer 740, free magnetic layer 736, tunneling barrier layer 734, and reference magnetic layer 732 of the selected OST-MTJ stack. The spin polarized current exerts a spin transfer torque on free magnetic layer 736, which helps overcome the inherent damping of the magnetic material making up the free layer 736. The spin transfer torque is composed of an in-plane spin transfer torque and a perpendicular spin transfer torque. In one embodiment, when switching the free layer 736 in one direction (e.g., from the parallel direction to the anti-parallel direction), the in-plane spin transfer torque is caused by the transverse spin current generated by the in-plane polarization magnetic layer 750 and the perpendicular spin transfer torque is caused by the reflected spin current generated by the reference magnetic layer 732. This causes the magnetization vector of the free magnetic layer 736 to precess about its axis, which is shown in FIG. 7a.

The spin-polarized current, which is generated by application of the switching current to the selected OST-MTJ structure 730", alternates between a maximum spin-current value and a minimum spin current value at the same first frequency. The magnitude of the spin transfer torque exerted on the magnetic vector of the free layer 736 is proportional to the spin-current value because at higher spin-current values, there are more spin-polarized electrons flowing through free layer 736. Therefore, the magnitude of the spin transfer torque alternates between a maximum spin torque magnitude and a minimum spin torque magnitude at the same first frequency.

The in-plane spin transfer torque causes the magnetic vector of the free magnetic layer 736 to precess, as depicted in FIG. 7a. The precession of the magnetic vector of free magnetic layer 736 occurs at a predetermined precession frequency. In some embodiments, the first frequency is synchronized with the predetermined precession frequency. Because the magnitude of the in-plane spin transfer torque alternates between the maximum spin torque magnitude and the minimum spin torque magnitude at the first frequency, these magnitude oscillations are also synchronized with the predetermined precession frequency. As depicted in FIG. 7a (middle, right), the in-plane spin transfer torque is at or near the maximum spin torque magnitude when the in-plane spin transfer torque opposes the inherent damping of the free magnetic layer 736. Also shown in FIG. 7a. (middle left), the in-plane spin transfer torque is at or near the minimum spin torque magnitude when the in-plane spin transfer torque enhances the inherent damping of the free magnetic layer 736. Therefore, the in-plane spin transfer torque from in-plane polarizer 750 provides a net spin torque throughout the precession that opposes the damping characteristic of the free magnetic layer 736. The in-plane spin transfer torque from the in-plane polarization layer 750 thereby assists the perpendicular spin transfer torque from the reference layer 732 in switching the magnetization direction of the free layer. Thus, devices using a STNO 770, a metallic bit line 760, and a plurality of OST-MTJ structures 730' (each comprising an in-plane polarizer 750, and a perpendicular MTJ) can enhance the efficiency of switching the magnetic direction of the free magnetic layer 736 of the selected OST-MTJ 730" during the writing process.

In particular, the structures described herein utilize a STNO that has been designed to produce oscillations in the current value of the switching current that are synchronized with the predetermined precession frequency of the free magnetic layer 736 during the writing process for a selected OST-MTJ stack. As described above, this system provides a net in-plane spin transfer torque throughout the whole precession cycle and therefore significantly enhances the free layer switching process in both switching directions, which will result in faster write times and lower switching threshold currents.

Figure 14:
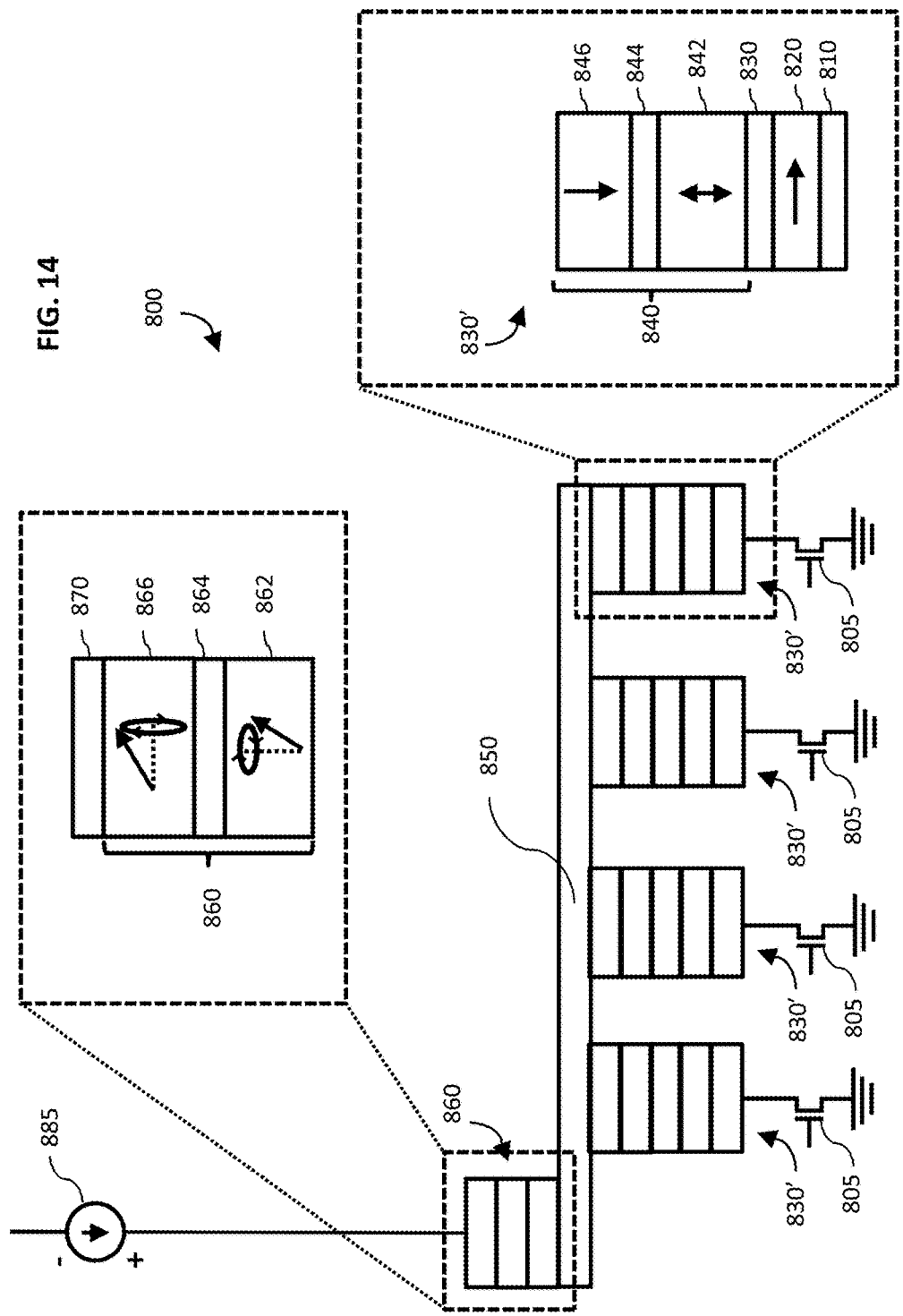
FIG. 14 illustrates an alternative embodiment of an MRAM device utilizing a STNO connected to a plurality of OST-MTJ structures by a metallic bit line, where each OST-MTJ structure comprises an in-plane polarizing magnetic layer having a fixed magnetization direction, and a MTJ structure.

An alternative embodiment is shown in FIG. 14. In this embodiment, magnetic device 800 has had its STNO stack 860 inverted with respect to the embodiment shown in FIG. 12. Similarly, magnetic device 800 has had each OST-MTJ stack 830' inverted with respect to the embodiment shown in FIG. 12. In particular, each OST-MTJ stack 830' includes a seed layer 810. In-plane polarization magnetic layer 820 is placed over seed layer 810. In-plane polarization magnetic layer 820 has the same properties, construction and characteristics as in-plane polarization magnetic layer 750, discussed above. Nonmagnetic spacer 830 is placed over in-plane polarization magnetic layer 820 and has the same properties, construction and characteristics as nonmagnetic spacer 740, discussed above. MTJ 840 is generally constructed of free layer 842 (which is placed over nonmagnetic spacer 830) and reference layer 846. Free layer 842 and reference layer 846 are spatially separated from each other by tunneling barrier layer 844, which is made of an insulating material. Reference magnetic layer 846 and free magnetic layer 842 have the same properties, construction and characteristics as reference magnetic layer 732 and free magnetic layer 736, respectively, discussed above. MTJ 840 is placed over nonmagnetic spacer 830. Metallic bit line 850 is placed over each OST-MTJ structure (i.e., placed over the plurality of reference layers 846). Metallic bit line 850 has the same properties, construction and characteristics as metallic bit line 760, discussed above. Perpendicular spin torque oscillator layer 862 is placed over metallic bit line 850. Perpendicular spin torque oscillator layer 862 has the same properties, construction and characteristics as perpendicular spin torque oscillator layer 776, discussed above. Nonmagnetic spin torque oscillator barrier layer 864 is placed over perpendicular torque oscillator layer 862 and has the same properties, construction and characteristics as non-magnetic spin torque oscillator barrier layer 874, discussed above. In-plane spin torque oscillator layer 866 is placed over nonmagnetic spin torque oscillator barrier layer 864. In-plane spin torque oscillator layer 866 has the same properties, construction and characteristics as in-plane spin torque oscillator layer 772, discussed above. Finally, capping layer 870 is placed over STNO 860. The programming voltage can be provided by a voltage source 885. OST-MTJ stacks can be selected for writing, for example, using transistors 805. Other than the ordering of the layers, magnetic device 800 operates in the same manner as described with respect to the embodiment shown in FIG. 7a. Thus, just as shown in FIG. 7a, the in-plane spin transfer torque 610 provides a net benefit of enhancing the efficiency of the switching throughout the entire precession cycle of free layer 862.

All of the layers of devices 700 and 800 illustrated in FIGS. 8 and 12 can be formed by a thin film sputter deposition system as would be appreciated by one skilled in the art. The thin film sputter deposition system can include the necessary physical vapor deposition (PVD) chambers, each having one or more targets, an oxidation chamber and a sputter etching chamber. Typically, the sputter deposition process involves a sputter gas (e.g., oxygen, argon, or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture MTJ stack 700 and 800 are well-known to those skilled in the art and will not be described in detail herein so as not to unnecessarily obscure aspects of the disclosure herein.

It should be appreciated to one skilled in the art that a plurality of MTJ structures 700 and 800 can be manufactured and provided as respective bit cells of an STT-MRAM device. In other words, each MTJ stack 700 and 800 can be implemented as a bit cell for a memory array having a plurality of bit cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:
1. A magnetic device comprising:
a plurality of orthogonal spin transfer magnetic tunnel junctions (OST-MTJs) in a first plane, each OST-MTJ comprising an in-plane polarization magnetic layer, a non-magnetic spacer, a reference magnetic layer, a non-magnetic tunnel barrier layer and a free magnetic layer; the in-plane polarization magnetic layer separated from the free magnetic layer by the non-magnetic spacer, the free magnetic layer and the reference magnetic layer separated by the non-magnetic tunnel barrier layer; the in-plane polarization magnetic layer having a magnetization vector that is parallel to the first plane; the reference magnetic layer having a magnetization vector that is perpendicular to the first plane and having a fixed magnetization direction, the free magnetic layer having a magnetization vector that is perpendicular to the first plane and having a magnetization direction that can switch from a first magnetization direction to a second magnetization direction and from the second magnetization direction to the first magnetization direction, with a switching process that involves precessions at a precession radius around an axis perpendicular to the first plane, the magnetization vector of the free magnetic layer having a predetermined precession frequency;
a metallic bit line in a second plane and coupled to the plurality of OST-MTJs; and
a spin torque nano oscillator (STNO) in a third plane and coupled to the metallic bit line, the spin torque nano oscillator comprising an in-plane spin torque oscillator layer, a non-magnetic spin torque oscillator barrier layer, and a perpendicular spin torque oscillator layer, the in-plane spin torque oscillator layer and the perpendicular spin torque oscillator layer separated by the non-magnetic spin torque oscillator barrier layer, the in-plane spin torque oscillator layer having a magnetization vector that precesses around an in-plane anisotropy axis or precesses in the third plane upon application of a programming voltage pulse, the perpendicular spin torque oscillator layer having a magnetization vector that precesses around an out-of-plane anisotropy axis upon application of the programming voltage pulse;
wherein application of the programming voltage pulse to the magnetic device results in a switching current pulse, the switching current pulse alternating between a maximum current value and a minimum current value at a first frequency;
wherein application of the switching current pulse to the in-plane polarization magnetic layer, the non-magnetic spacer, the reference magnetic layer, the non-magnetic tunnel barrier layer and the free magnetic layer results in a spin-polarized current having spin-polarized electrons, the spin-polarized current alternating between a maximum spin-current value and a minimum spin-current value at the first frequency;
wherein the spin-polarized electrons exert a spin transfer torque on the magnetic vector of the free magnetic layer, the spin transfer torque alternating between a maximum magnitude and a minimum magnitude at the first frequency;

wherein the first frequency is synchronized with the predetermined precession frequency of the free magnetic layer, thereby causing the spin transfer torque to be at the maximum magnitude when the spin transfer torque increases the precession radius of the magnetization vector of the free magnetic layer, and at the minimum magnitude when the spin transfer torque decreases the precession radius of the magnetic vector of the free magnetic layer, thereby improving the switching process of the free magnetic layer from the first magnetization direction to the second magnetization direction and from the second magnetization direction to the first magnetization direction.

2. The magnetic device of claim 1, wherein a difference in frequency between the first frequency and the predetermined precession frequency of the free magnetic layer is less than twenty percent of the predetermined precession frequency of the free magnetic layer.

3. The magnetic device of claim 1, wherein a difference in frequency between the first frequency and the predetermined precession frequency of the free magnetic layer is less than ten percent of the predetermined precession frequency of the free magnetic layer.

4. The magnetic device of claim 1, wherein a difference in frequency between the first frequency and the predetermined precession frequency of the free magnetic layer is less than five percent of the predetermined precession frequency of the free magnetic layer.

5. The magnetic device of claim 1, wherein a difference in frequency between the first frequency and the predetermined precession frequency of the free magnetic layer is less than two percent of the predetermined precession frequency of the free magnetic layer.

6. The magnetic device of claim 1, wherein the metallic bit line comprises Ruthenium or Rhodium.

7. The magnetic device of claim 1, wherein the metallic bit line comprises a layer of Ruthenium, the layer of Ruthenium being between 2 and 10 angstroms thick.

8. The magnetic device of claim 1, wherein the magnetization vector of the in-plane spin torque oscillator layer and the magnetization vector of at least one in-plane polarization magnetic layer are magnetically coupled.

9. The magnetic device of claim 1, wherein the programming voltage pulse comprises a direct voltage.

10. The magnetic device of claim 1, wherein the reference magnetic layer comprises CoFeB, the non-magnetic tunnel barrier layer comprises MgO, the free magnetic layer comprises CoFeB, the non-magnetic spacer comprises MgO, and the in-plane polarization magnetic layer comprises CoFeB.

11. A magnetic device comprising:

a plurality of orthogonal spin transfer magnetic tunnel junctions (OST-MTJs) in a first plane, each OST-MTJ comprising a reference magnetic layer, a non-magnetic tunnel barrier layer, a free magnetic layer, a non-magnetic spacer, and an in-plane polarization magnetic layer; the non-magnetic tunnel barrier layer disposed over the reference magnetic layer, the reference magnetic layer having a magnetization vector that is perpendicular to the first plane and having a fixed magnetization direction; the free magnetic layer disposed over the non-magnetic tunnel barrier layer, the free magnetic layer having a magnetization vector that is perpendicular to the first plane and having a magnetization direction that can switch from a first magnetization direction to a second magnetization direction and from the second magnetization direction to the first magnetization direction, with a switching process that involves precessions at a precession radius around an axis perpendicular to the first plane, the magnetization vector of the free magnetic layer having a predetermined precession frequency; the non-magnetic spacer disposed over the free magnetic layer; the in-plane polarization magnetic layer disposed over the non-magnetic spacer, the in-plane polarization magnetic layer having a magnetization vector that is parallel to the first plane;

a metallic bit line in a second plane and disposed over the plurality of OST-MTJs; and a spin torque nano oscillator (STNO) in a third plane and coupled to the metallic bit line, the spin torque nano oscillator comprising an in-plane spin torque oscillator layer, a non-magnetic spin torque oscillator barrier layer, and a perpendicular spin torque oscillator layer, the in-plane spin torque oscillator layer and the perpendicular spin torque oscillator layer separated by the non-magnetic spin torque oscillator barrier layer, the in-plane spin torque oscillator layer having a magnetization vector that precesses around an in-plane anisotropy axis or precesses in the third plane upon application of a programming voltage pulse, the perpendicular spin torque oscillator layer having a magnetization vector that precesses around an out-of-plane anisotropy axis upon application of the programming voltage pulse;

wherein application of the programming voltage pulse to the magnetic device results in a switching current pulse, the switching current pulse alternating between a maximum current value and a minimum current value at a first frequency;

wherein application of the switching current pulse to the in-plane polarization magnetic layer, the non-magnetic spacer, and the MTJ results in a spin-polarized current having spin-polarized electrons, the spin-polarized current alternating between a maximum spin-current value and a minimum spin-current value at the first frequency;

wherein the spin-polarized electrons exert a spin transfer torque on the magnetic vector of the free magnetic layer, the spin transfer torque alternating between a maximum magnitude and a minimum magnitude at the first frequency;

wherein the first frequency is synchronized with the predetermined precession frequency of the free magnetic layer, thereby causing the spin transfer torque to be at the maximum magnitude when the spin transfer torque increases the precession radius of the magnetization vector of the free magnetic layer, and at the minimum magnitude when the spin transfer torque decreases the precession radius of the magnetic vector of the free magnetic layer, thereby improving the switching process of the free magnetic layer from the first magnetization direction to the second magnetization direction and from the second magnetization direction to the first magnetization direction.

12. The magnetic device of claim 11, wherein a difference in frequency between the first frequency and the predetermined precession frequency of the free magnetic layer is less than twenty percent of the predetermined precession frequency of the free magnetic layer.

13. The magnetic device of claim 11, wherein a difference in frequency between the first frequency and the predetermined precession frequency of the free magnetic layer is less than ten percent of the predetermined precession frequency of the free magnetic layer.

14. The magnetic device of claim 11, wherein a difference in frequency between the first frequency and the predetermined precession frequency of the free magnetic layer is less than five percent of the predetermined precession frequency of the free magnetic layer.

15. The magnetic device of claim 11, wherein a difference in frequency between the first frequency and the predetermined precession frequency of the free magnetic layer is less than two percent of the predetermined precession frequency of the free magnetic layer.

16. The magnetic device of claim 11, wherein the metallic bit line comprises Ruthenium or Rhodium.

17. The magnetic device of claim 11, wherein the metallic bit line comprises a layer of Ruthenium, the layer of Ruthenium being between 2 and 10 angstroms thick.

18. The magnetic device of claim 11, wherein the magnetization vector of the in-plane spin torque oscillator layer and the magnetization vector of at least one polarization magnetic layer are magnetically coupled.

19. The magnetic device of claim 11, wherein the programming voltage pulse comprises a direct voltage.

20. The magnetic device of claim 11, wherein the reference magnetic layer comprises CoFeB, the non-magnetic tunnel barrier layer comprises MgO, the free magnetic layer comprises CoFeB, the non-magnetic spacer comprises MgO, and the in-plane polarization magnetic layer comprises CoFeB.

21. A magnetic device comprising:
a plurality of reference magnetic layers in a first plane, each reference magnetic layer having a magnetization vector that is perpendicular to the first plane and having a fixed magnetization direction;
a plurality of non-magnetic tunnel barrier layers in a second plane, each non-magnetic tunnel barrier layer disposed over one reference magnetic layer;
a plurality of free magnetic layers in a third plane, each free magnetic layer disposed over one non-magnetic tunnel barrier layer, each free magnetic layer having a magnetization direction that can switch from a first magnetization direction to a second magnetization direction and from the second magnetization direction to the first magnetization direction, with a switching process that involves precessions at a precession radius around an axis perpendicular to the third plane, the magnetization vector of the free magnetic layer having a predetermined precession frequency, the plurality of reference magnetic layers, the plurality of non-magnetic tunnel barrier layers and the plurality of free magnetic layers forming a plurality of magnetic tunnel junctions;
a plurality of non-magnetic spacers in a fourth plane, each non-magnetic spacer disposed over one free magnetic layer;
a plurality of in-plane polarization magnetic layers in a fifth plane, each in-plane polarization magnetic layer disposed over one non-magnetic spacer, the in-plane polarization magnetic layer having a magnetization vector that is parallel to the fifth plane;
a metallic bit line in a sixth plane and disposed over the plurality of in-plane polarization magnetic layers;
an in-plane spin torque oscillator layer in a seventh plane and disposed over the metallic bit line, the in-plane spin torque oscillator layer having a magnetization vector that precesses around an in-plane anisotropy axis upon application of a programming voltage pulse;
a non-magnetic spin torque oscillator barrier layer in an eighth plane and disposed over the in-plane spin torque oscillator layer; and
a perpendicular spin torque oscillator layer in a ninth plane and disposed over the non-magnetic spin torque oscillator barrier layer, the perpendicular spin torque oscillator layer having a magnetization vector that precesses around an out-of-plane anisotropy axis upon application of the programming voltage pulse;
wherein application of the programming voltage pulse to the magnetic device results in a switching voltage across the in-plane polarization magnetic layer, the non-magnetic spacer and the MTJ, the switching voltage oscillating between a maximum voltage value and a minimum voltage value at a first frequency;
wherein the first frequency is synchronized with the predetermined precession frequency of the free magnetic layer, thereby enhancing the efficiency of the switching process from the first magnetization direction to the second magnetization direction and from the second magnetization direction to the first magnetization direction.

22. The magnetic device of claim 21, wherein application of the switching voltage across the in-plane polarization magnetic layer, the non-magnetic spacer and the MTJ generates a spin-polarized current having spin-polarized electrons, the spin-polarized current alternating between a maximum spin-current value and a minimum spin-current value at the first frequency, the spin-polarized electrons exerting a spin transfer torque on the magnetic vector of the free magnetic layer.

23. The magnetic device of claim 21, wherein the first frequency is synchronized with the predetermined precession frequency of the free magnetic layer, thereby causing the spin transfer torque to be at the maximum magnitude when the spin transfer torque increases the precession radius of the magnetization vector of the free magnetic layer, and at the minimum magnitude when the spin transfer torque decreases the precession radius of the magnetic vector of the free magnetic layer.

24. The magnetic device of claim 21, wherein a difference in frequency between the first frequency and the predetermined precession frequency of the free magnetic layer is less than twenty percent of the predetermined precession frequency of the free magnetic layer.

25. The magnetic device of claim 21, wherein a difference in frequency between the first frequency and the predetermined precession frequency of the free magnetic layer is less than ten percent of the predetermined precession frequency of the free magnetic layer.

26. The magnetic device of claim 21, wherein a difference in frequency between the first frequency and the predetermined precession frequency of the free magnetic layer is less than five percent of the predetermined precession frequency of the free magnetic layer.

27. The magnetic device of claim 21, wherein a difference in frequency between the first frequency and the predetermined precession frequency of the free magnetic layer is less than two percent of the predetermined precession frequency of the free magnetic layer.

28. The magnetic device of claim 21, wherein the metallic spacer comprises Ruthenium or Rhodium.

29. The magnetic device of claim 21, wherein the metallic spacer comprises a layer of Ruthenium, the layer of Ruthenium being between 2 and 10 angstroms thick.

30. The magnetic device of claim 21, wherein the magnetization vector of the in-plane spin torque oscillator layer and the magnetization vector of the spin current magnetic layer are magnetically coupled.

31. The magnetic device of claim 21, wherein the magnetization vector of the polarization magnetic layer is fixed.

32. The magnetic device of claim 21, wherein the programming voltage pulse comprises a direct voltage.

33. The magnetic device of claim 21, wherein the reference magnetic layer comprises CoFeB, the non-magnetic tunnel barrier layer comprises MgO, the free magnetic layer comprises CoFeB, the non-magnetic spacer comprises MgO, and the in-plane polarization magnetic layer comprises CoFeB.

34. The magnetic device of claim 21, wherein the in-plane spin torque oscillator layer comprises CoFeB and the perpendicular spin torque oscillator layer comprises CoFeB.

\* \* \* \* \*